(12) United States Patent
Umeda

(10) Patent No.: US 8,242,944 B2
(45) Date of Patent: Aug. 14, 2012

(54) DIGITAL-TO-ANALOG CONVERTER CIRCUIT INCLUDING ADDER DRIVE CIRCUIT AND DISPLAY

(75) Inventor: Kengo Umeda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1149 days.

(21) Appl. No.: 12/081,831

(22) Filed: Apr. 22, 2008

(65) Prior Publication Data

US 2008/0266231 A1    Oct. 30, 2008

(30) Foreign Application Priority Data

Apr. 26, 2007 (JP) .................................. 2007-116401
Feb. 4, 2008 (JP) .................................. 2008-023989

(51) Int. Cl.
*H03M 1/66* (2006.01)
(52) U.S. Cl. .................. 341/145; 341/144; 341/154
(58) Field of Classification Search ........... 341/144–145
See application file for complete search history.

(56) References Cited

U.S. PATENT DOCUMENTS

| | | | |
|---|---|---|---|
| 4,873,525 A | 10/1989 | Iida | |
| 5,914,682 A * | 6/1999 | Noguchi | 341/145 |
| 6,232,941 B1 | 5/2001 | Ode et al. | |
| 6,268,817 B1 * | 7/2001 | Min et al. | 341/145 |
| 6,288,661 B1 * | 9/2001 | Holberg | 341/145 |
| 7,750,900 B2 * | 7/2010 | Tsuchi et al. | 345/210 |

FOREIGN PATENT DOCUMENTS

| | | |
|---|---|---|
| JP | 57-202126 A | 12/1982 |
| JP | 57-202126 (A) | 12/1982 |
| JP | 63-224415 A | 9/1988 |
| JP | 11-109928 | 4/1999 |

* cited by examiner

*Primary Examiner* — Khai M Nguyen
(74) *Attorney, Agent, or Firm* — McGinn IP Law Group, PLLC

(57) ABSTRACT

A digital-to-analog conversion circuit includes a gradation voltage generation circuit, a most-significant-bits decoder circuit, a least-significant-bits decoder circuit and a calculation circuit. The gradation voltage generation circuit generates multiple main voltages corresponding to most significant bits of the inputted data, and multiple sub voltages corresponding to least significant bits of the inputted data. The most-significant-bits decoder circuit selects one of the main voltages in accordance with the most significant bits, and the least-significant-bits decoder circuit selects one of the sub voltages in accordance with the least significant bits. The calculator circuit performs calculation processing by use of a first main voltage selected by the most-significant-bits decoder circuit, a first sub voltage selected by the least-significant-bits decoder circuit, and a reference voltage.

20 Claims, 24 Drawing Sheets

Fig. 5

| SYMBOL | EXEMPLARY VOLTAGE VALUE [V] |
|---|---|
| Va7 | 15.3 |
| Va6 | 14.3 |
| Va5 | 13.3 |
| Vb7 | 13.175 |
| Vb6 | 13.05 |
| Vb5 | 12.925 |
| Vb4 | 12.8 |
| Vb3 | 12.675 |
| Vb2 | 12.55 |
| Vb1 | 12.425 |
| Va4,Vb0 | 12.3 |
| Va3 | 11.3 |
| Va2 | 10.3 |
| Va1 | 9.3 |
| Va0 | 8.3 |

Fig. 6

| HIGH 3 BITS | SELECTED VOLTAGE |
|---|---|
| 111 | Va7 |
| 110 | Va6 |
| 101 | Va5 |
| 100 | Va4 |
| 011 | Va3 |
| 010 | Va2 |
| 001 | Va1 |
| 000 | Va0 |

Fig. 7

| LOW 3 BITS | SELECTED VOLTAGE |
|---|---|
| 111 | Vb7 |
| 110 | Vb6 |
| 101 | Vb5 |
| 100 | Vb4 |
| 011 | Vb3 |
| 010 | Vb2 |
| 001 | Vb1 |
| 000 | Vb0 |

Fig. 12

| HIGH 3-BIT | | | LOW 3-BIT | | | OUTPUT VOLTAGE |
|---|---|---|---|---|---|---|
| b5 | b4 | b3 | b2 | b1 | b0 | |
| 1 | 1 | 1 | 1 | 1 | 1 | Va7+Vb7-Vref |
| 1 | 1 | 1 | 1 | 1 | 0 | Va7+Vb6-Vref |
| ⋮ | ⋮ | ⋮ | ⋮ | ⋮ | ⋮ | ⋮ |
| 1 | 1 | 1 | 0 | 0 | 0 | Va7+Vb0-Vref |
| 1 | 1 | 0 | 1 | 1 | 1 | Va6+Vb7-Vref |
| ⋮ | ⋮ | ⋮ | ⋮ | ⋮ | ⋮ | ⋮ |
| 1 | 0 | 0 | 0 | 0 | 0 | Va4+Vb0-Vref |
| 0 | 1 | 1 | 1 | 1 | 1 | Va3+Vb7-Vref |
| 0 | 1 | 1 | 1 | 1 | 0 | Va3+Vb6-Vref |
| ⋮ | ⋮ | ⋮ | ⋮ | ⋮ | ⋮ | ⋮ |
| 0 | 1 | 1 | 0 | 0 | 0 | Va3+Vb0-Vref |
| 0 | 1 | 0 | 1 | 1 | 1 | Va2+Vb7-Vref |
| ⋮ | ⋮ | ⋮ | ⋮ | ⋮ | ⋮ | ⋮ |
| 0 | 0 | 0 | 0 | 0 | 1 | Va70+Vb1-Vref |
| 0 | 0 | 0 | 0 | 0 | 0 | Va0+Vb0-Vref |

Fig. 13

| THE NUMBER OF BITS | RELATED ART | | THE PRESENT INVENTION | |
|---|---|---|---|---|
| | DECODER AREA | THE NUMBER OF TONE LINES | DECODER AREA | THE NUMBER OF TONE LINES |
| 8 | EQUAL TO THAT OF 6 BITS 3/8 THE ORDINARY | 1/4 THE ORDINARY | EQUAL TO THAT OF 5 BITS 1/8 THE ORDINARY | 1/8 THE ORDINARY |
| 10 | EQUAL TO THAT OF 8 BITS 3/8 THE ORDINARY | 1/4 THE ORDINARY | EQUAL TO THAT OF 6 BITS 1/16 THE ORDINARY | 1/16 THE ORDINARY |
| 12 | EQUAL TO THAT OF 10 BITS 3/8 THE ORDINARY | 1/4 THE ORDINARY | EQUAL TO THAT OF 7 BITS 1/32 THE ORDINARY | 1/32 THE ORDINARY |
| 14 | EQUAL TO THAT OF 12 BITS 3/8 THE ORDINARY | 1/4 THE ORDINARY | EQUAL TO THAT OF 8 BITS 1/64 THE ORDINARY | 1/64 THE ORDINARY |

DIGITAL-TO-ANALOG CONVERTER CIRCUIT INCLUDING ADDER DRIVE CIRCUIT AND DISPLAY

BACKGROUND OF THE INVENTION

1. Field of the Invention

The present invention relates to a digital-to-analog (D/A) converter circuit for converting digital signals to analog signals, a drive circuit for a display, and a display that makes use of the drive circuit.

2. Description of Related Art

With its thin, light and low-power consumption characteristics, liquid crystal displays (LCDs) are widely employed for office automation, customer use, industrial use and the like, as a flat panel display essential in the age of info-communication. Generally, such a liquid crystal display is provided with a liquid crystal drive circuit (liquid crystal drive IC) which includes a gradation voltage generator, a decoder circuit, an amplifier and the like. The gradation voltage generation circuit generates multiple gradation voltages. The decoder circuit selects a corresponding gradation voltage from the multiple gradation voltages according to the inputted image data. The amplifier performs current amplification on the gradation voltage selected by the decoder circuit, which is then supplied to the liquid crystal panel via source wirings.

FIG. 22 is a block diagram showing a configuration of a source-side liquid crystal drive circuit 1 of a conventional 8 bit type. As shown in FIG. 22, the source-side liquid crystal drive circuit 1 includes a receiver and serial/parallel conversion circuit 2, a shift register circuit 3, a latch circuit 4, a gradation voltage generation circuit 5, a decoder circuit 6, an amplifier 7 and the like. The receiver and serial/parallel conversion circuit 2 receives serial image data transmitted from a timing controller (not shown), and converts the image data into parallel pixel-by-pixel gradation data D00 to D07. The shift register circuit 3 generates, in accordance with clock signals inputted thereto, data capture signals to be used in the latch circuit 4, and outputs the signals to the latch circuit 4.

According to the data capture signals inputted from the shift register circuit 3, the latch circuit 4 retains digital gradation data corresponding to the number of outputs. The gradation voltage generation circuit 5 generates gradation voltages VDATA0 to VDATA255 and inputs the voltages to the decoder circuit 6. From among the inputted gradation voltages VDATA0 to VDATA255, the decoder circuit 6 selects, for each output, a gradation voltage corresponding to the gradation data D00 to D07 transmitted from the latch circuit 4. Note that in the decoder circuit 6, the gradation voltages VDATA0 to VDATA255 are shared among outputs of the same polarity.

Thereafter, each of the gradation voltages selected by the decoder circuit 6 is, for example, outputted to input terminals t1 to t720 of amplifiers 7 respectively provided for each output, in a case where the number of outputs is 720. When the gradation voltages are selected by the decoder circuit 6, all of the outputs of the amplifiers 7 charge and discharge source wirings (out1 to out720), and supply the selected voltages, via the source wirings, to corresponding pixels on the liquid crystal display panel.

FIG. 23 shows a configuration of a conventional decoder circuit 6. As shown in FIG. 23, the decoder circuit 6 includes 720 decoder unit circuits 61 corresponding to the number of outputs. The gradation voltages VDATA0 to VDATA255 are shared among the 720 decoder unit circuits 61. Each decoder unit circuit 61 may be configured of 8 switch devices 62 in series to which pieces of gradation data D00 to D07 are respectively inputted in control units. Gradation voltages VDATA0 to VDATA255 are respectively supplied to first ends of the 8 switch devices 62 in series, and second ends thereof are collectively connected to an input terminal of the amplifier 7. These switch devices 62 are controlled to be turned on/off according to the gradation data VDATA0 to VDATA255 transmitted from the latch circuit 5. Then, among the gradation voltages VDATA0 to VDATA255, the gradation voltages in which all 8 of the switch devices 62 are turned on are outputted to each of the input terminals t1 to t720 of the amplifiers 7. Note that the decoder circuit 6 may be configured otherwise.

In recent years, there is an increasing demand for displaying a larger number of colors on liquid crystal displays used for TV sets. Accordingly, the need for multi-bit liquid crystal drive circuits is enlarging year by year, and a 10-bit or 12-bit liquid crystal drive circuit has become the mainstream. However, in the aforementioned decoder circuit 6, a doubled number of switch devices 62 is required for every extra bit, and the circuit area is also doubled. Since the decoder circuit 6 part mainly accounts for the chip area of a liquid crystal drive circuit, an increase in the number of bits enlarges the chip area of a liquid crystal drive circuit to a great extent. A 10-bit liquid crystal drive circuit, for example, requires a chip area four times larger than that of an 8-bit liquid crystal drive circuit. As for a 12-bit liquid crystal drive circuit, a chip area of 16 times the area of the 8-bit liquid crystal drive circuit is required. For this reason, the cost for a liquid crystal drive circuit rises, while the implementation possibility is lowered. Similarly, the required number of wirings for gradation voltages (gradation lines) is doubled for every extra bit, excessively increasing the amount of wirings in the case of multiple bits. This increase in the amount of wirings influences the chip area.

Hence, implementation of a multi-bit liquid crystal drive circuit is difficult with merely a simple gradation voltage generation circuit 5 and a decoder circuit 6. In this regard, a conventional technique of reducing the area and number of gradation lines of the decoder circuit 6 is proposed (Patent Document 1). FIG. 24 shows a conventional D/A conversion circuit 10 described in Patent Document 1. The D/A conversion circuit 10 shown in FIG. 24 is an example of a 6-bit liquid crystal drive circuit. The D/A conversion circuit 10 is provided with a ladder resistor circuit 11 that generates voltages V1 to V17, a decoder circuit 12, an amplifier 13, and a capacitor voltage dividing circuit 14 including capacitors C1, C2 and C3. The capacity ratio among the capacitors C1, C2 and C3 is set to be 1:2:1.

Here, an explanation will be given for an operation of the conventional D/A conversion circuit 10 described in Japanese Patent Application Laid-open Publication No. Hei 11-109928.

Firstly, the decoder circuit 12 selects, from voltages V1 to V17 generated by the ladder resistor circuit 11, two adjacent voltages corresponding to most significant four bits of the gradation data. For example, if the gradation data of the most significant four bits is 0000, V1 and V2 are selected. Meanwhile, if the gradation data of the most significant four bits is 1111, V16 and V17 are selected. Then, D/A conversion is carried out by dividing the difference between the two selected voltages through changing the connection state of the capacitors C1, C2 and C3 in accordance with least significant two bits of the gradation data. The amplifier 13 performs current amplification on the thus divided voltage, which is then supplied to source wirings. Hence, the D/A conversion circuit 10 is configured such that D/A conversion is performed on the gradation data of the least significant two bits with the capacitors C1, C2 and C3 of the capacitor voltage dividing circuit 14, while D/A conversion is performed on the gradation data of the most significant four bits with the ladder resistor circuit 11 and the decoder circuit 12.

By employing the above configuration, the chip area of a liquid crystal drive circuit can be made smaller because the decoder circuit 12 and the number of gradation lines can be reduced for the least significant two bits. For example, in a case of applying the conventional technique to an 8-bit liquid crystal drive circuit, the area of the decoder circuit is as large as 6 bits and the required number of gradation lines is 64. Meanwhile, in the case of a 10-bit liquid crystal drive circuit, the area of the decoder circuit is as large as 8 bits and the required number of gradation lines is 256.

However, the conventional D/A conversion circuit 10 has the following drawback. That is to say, the conventional D/A converter 10 requires three or more capacitors for the configuration of the capacitor voltage dividing circuit 14, and the capacitor values need to be in a ratio relationship. As it is difficult to achieve an ideal capacity ratio for all of the output pins, voltages vary among the output pins. In addition, since offset voltages differ among the outputs of the amplifiers 13, further variance occur among the outputted voltages. Moreover, since three or more capacitors are needed, complicated switching of the capacitors is required, which necessitates a large number of switch devices. For this reason, caused is a problem of deviation in the outputted voltages due to feed through of the switch devices (charge splitting effect). As has been described, the conventional D/A conversion circuit 10 tends to be influenced by production variation, which inhibits the fabrication of a high-precision D/A conversion circuit.

Furthermore, since D/A conversion by use of capacitors is performed only on the gradation data of least significant two bits, the area of the decoder circuit and number of gradation lines are increased along with an increase in the number of bits. Accordingly, the area of a chip cannot be reduced to a large extent. For example, in a case of a 12-bit liquid crystal drive circuit, the area of the decoder circuit is as large as 10 bits and 1024 gradation lines are required. In a case of a 14-bit liquid crystal drive circuit, the area of the decoder circuit is as large as 12 bits and as much as 4096 gradation lines are required. Thus, even by applying the conventional technique, the area of the multi-bit liquid crystal drive circuit cannot be reduced to a large extent, leading to a rise in the cost of the liquid crystal drive circuit.

The area of the decoder circuit can otherwise be reduced by increasing the number of least significant bits on which D/A conversion is performed by the capacitor voltage driving circuit 14, to three bits or four bits. In this case, however, the number of capacitors in the capacitor voltage driving circuit 14 needs to be increased, which does not reduce the chip area after all. Consequently, the problem of conversion precision due to production variation becomes prominent.

SUMMARY OF THE INVENTION

A D/A conversion circuit according to an exemplary aspect of the present invention includes a gradation voltage generation circuit, a most-significant-bits decoder circuit, a least-significant-bits decoder circuit and a calculation circuit. The gradation voltage generation circuit generates multiple main voltages corresponding to most significant bits of the inputted data, and multiple sub voltages corresponding to least significant bits of the inputted data. The most-significant-bits decoder circuit selects one of the main voltages in accordance with the most significant bits, and the least-significant-bits decoder circuit selects one of the sub voltages in accordance with the least significant bits. The calculator circuit performs calculation processing by use of a first main voltage selected by the most-significant-bits decoder circuit, a first sub voltage selected by the least-significant-bits decoder circuit, and a reference voltage. The area of the decoder circuit can be reduced by thus separating the decoder circuit to a decoder circuit for most significant bits and a decoder circuit for least significant bits.

A drive circuit according to another aspect of the present invention supplies a gradation voltage to multiple signal lines of a display. The drive circuit includes the above-mentioned D/A conversion circuit and certain numbers of the most-significant-bits decoder circuit, the least-significant-bits decoder circuit, and the calculation circuit, the certain number corresponding to the multiple signal lines. By separating the decoder circuit into those used for the most significant bits and for the least significant bits, the area of the decoder circuit can be reduced, leading to reduction in the chip area of the drive circuit.

A display according to another aspect of the present invention includes multiple pixels, a display panel and a drive circuit. The display panel includes multiple signal lines for transmitting a gradation voltage to the multiple pixels. The drive circuit is connected to the multiple signal lines and outputs a gradation voltage to the multiple pixels. The chip area of the drive circuit can be thus reduced, leading to a reduction in the area for mounting the drive circuit of the display panel.

The present invention provides a D/A conversion circuit, a drive circuit and a display which are capable of generating gradation voltages of multiple gradations without causing an increase in the chip area.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 5 is a table showing an example of gradation voltages generated by a gradation voltage generation circuit according to the first embodiment;

FIG. 6 is a table showing a relationship between gradation data (most significant three bits) of a most-significant-three-bits decoder and outputs (gradation voltages) thereof according to the first embodiment;

FIG. 7 is a table showing a relationship between gradation data (least significant three bits) of a least-significant-three-bits decoder and outputs (gradation voltages) thereof according to the first embodiment;

FIG. 12 is a table showing a relationship between gradation data and outputted voltages of the liquid crystal drive circuit according to the first embodiment;

FIG. 13 is a diagram for comparison of the required area and number of gradation lines of a decoder, between the present invention and a conventional technique;

DETAILED DESCRIPTION OF THE EXEMPLARY EMBODIMENTS

First Embodiment

Figure 1:
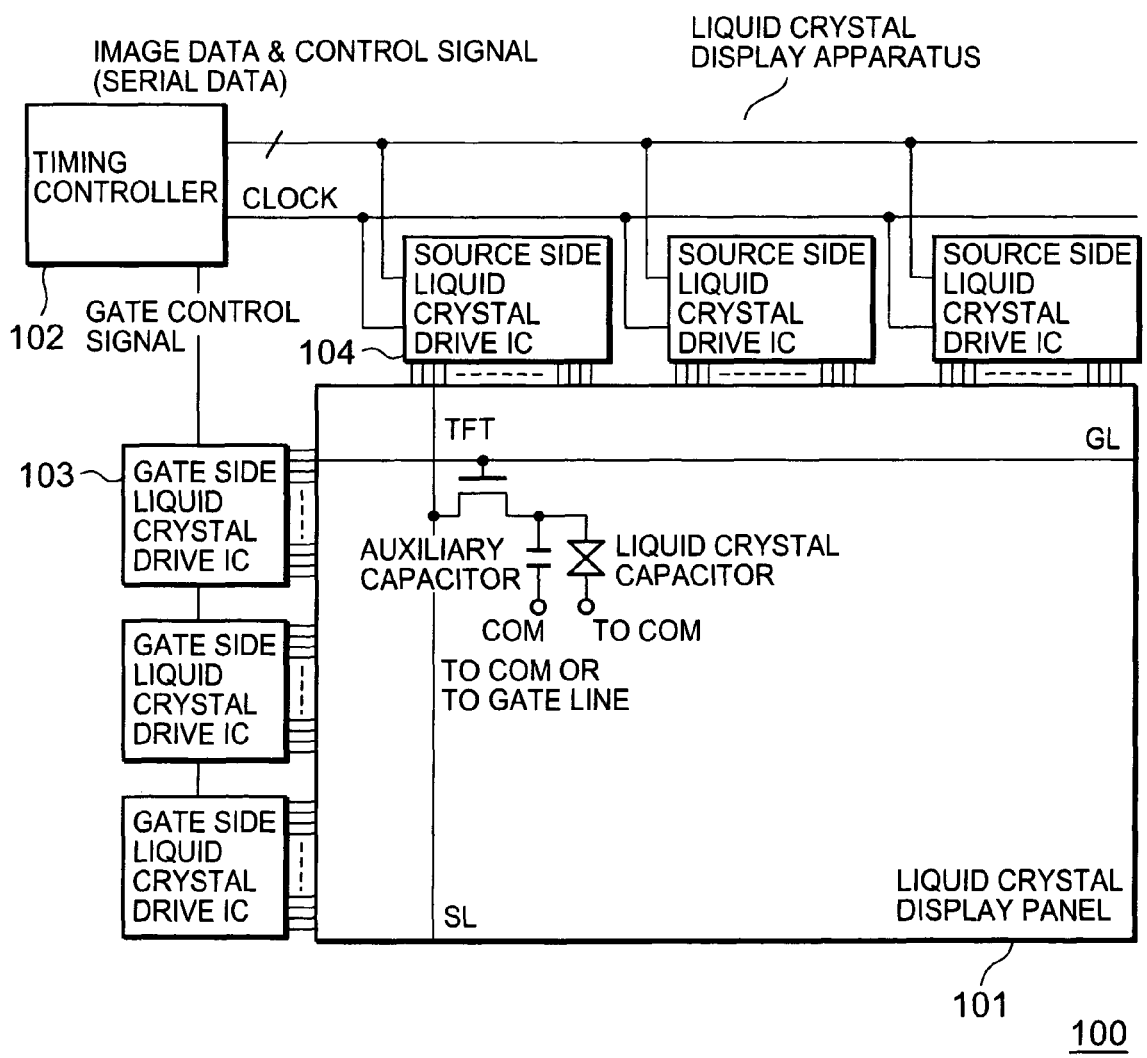
FIG. 1 is a diagram showing a configuration of a liquid crystal display according to a first exemplary embodiment.
Figure 2:
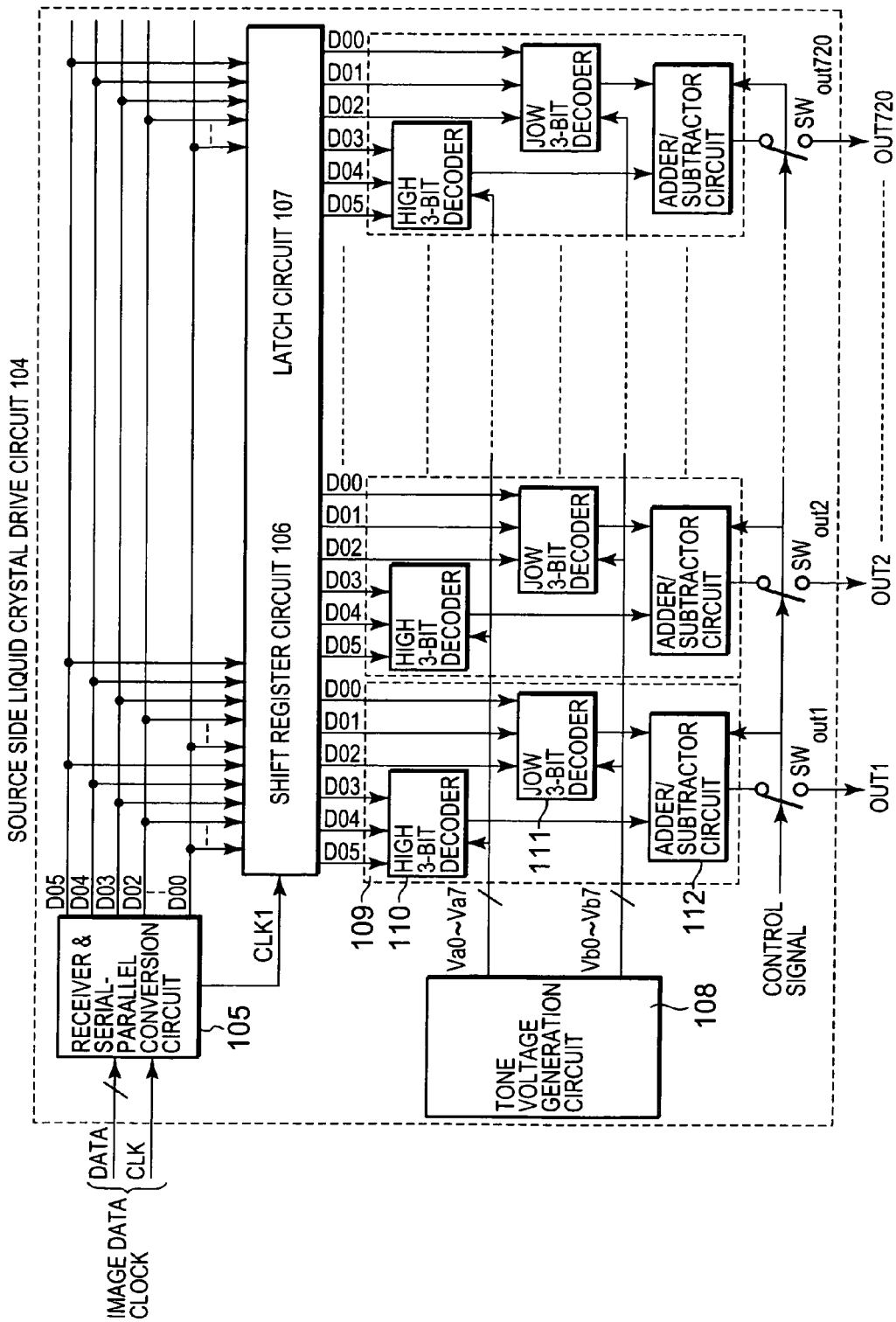
FIG. 2 is a diagram showing a configuration of a liquid crystal drive circuit according to the first embodiment.
Figure 3:
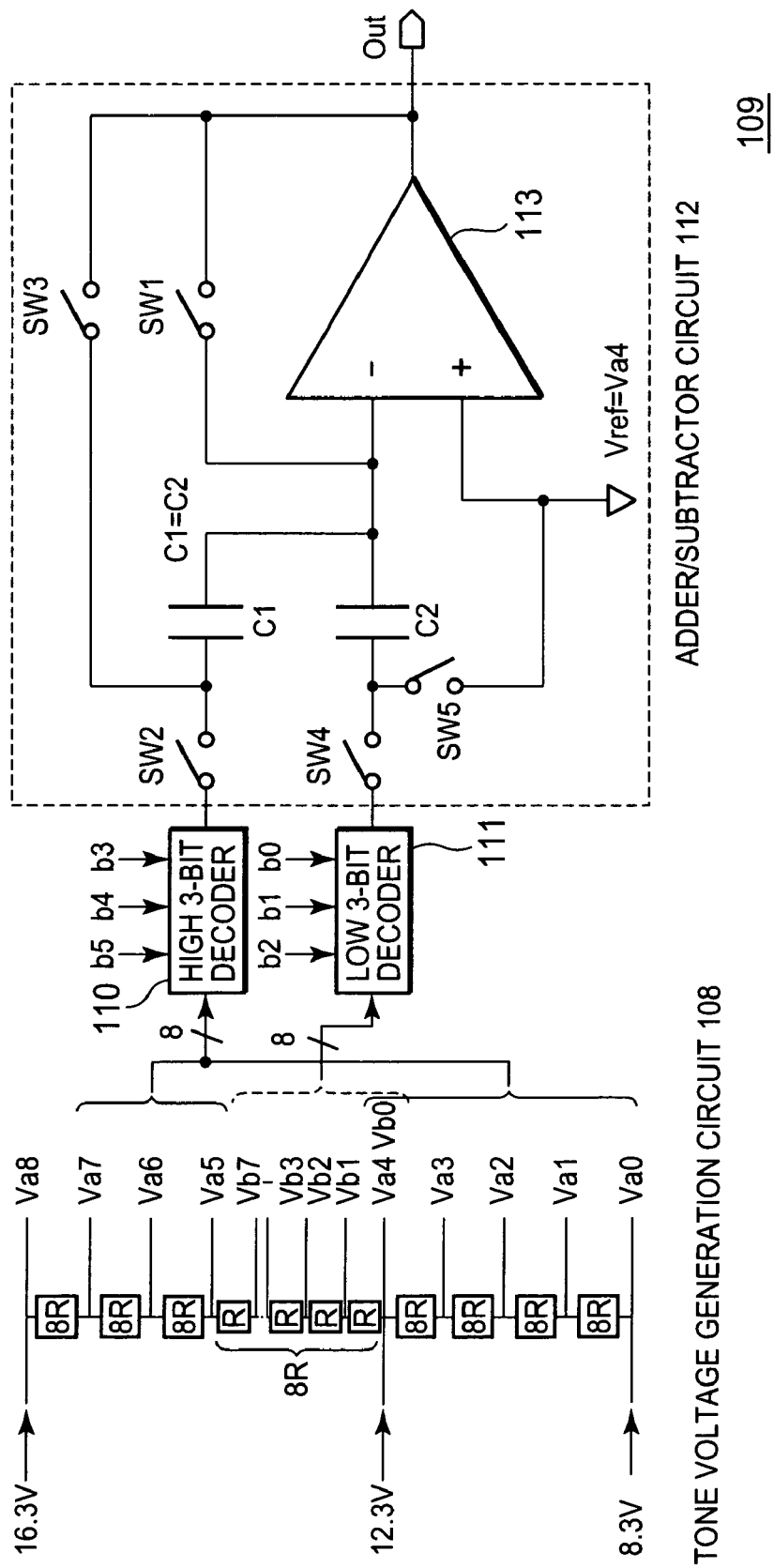
FIG. 3 is a diagram showing a configuration of a D/A conversion circuit according to the first embodiment.

An explanation will be given for a D/A conversion circuit, a drive circuit and a display according to a first embodiment of the present invention with reference to the drawings. FIG. 1 is a diagram showing a configuration of the display according to the embodiment. Here, a liquid crystal display 100 will be described as an example of a display. FIG. 2 is a diagram showing a configuration of a source-side liquid crystal drive circuit 104 used in the liquid crystal display 100. Here, a 6-bit source-side liquid crystal drive circuit 104 will be described. D/A conversion is performed by separating 6-bit gradation data into most significant three bits and least significant three bits. FIG. 3 is a diagram showing a configuration of a D/A conversion circuit mounted to the source-side liquid crystal drive circuit 104.

As shown in FIG. 1, the liquid crystal display 100 according to the embodiment includes a liquid crystal display panel 101, a timing controller 102, a gate-side liquid crystal drive circuit 103, and a source-side liquid crystal drive circuit 104. The liquid crystal display panel 101 includes a display region configured of multiple pixels. The liquid crystal panel 101 is configured such that liquid crystals are interposed between a device substrate on which TFTs (thin film transistors) are formed, and an opposing substrate that is disposed to face the device substrate. On the device substrate, gate lines (scanning lines) GL are formed in the horizontal direction, while source lines (signal lines) SL are formed in the vertical direction. The TFT, which is an active device, is provided in the vicinity of the intersection of the gate line GL and the source line SL. In addition, a pixel electrode is formed between the gate line GL and the source line SL. The gate of the TFT is connected to the gate line GL, the source electrode of thereof is connected to the source line SL, and the drain line thereof is connected to the pixel electrode, respectively. Meanwhile, common electrodes COM are formed on the opposing substrate. A pixel capacitor is formed between the pixel electrode and the common electrode COM. In addition, an auxiliary capacitor is provided between the gate line GL and the electrode connected to the source line SL of the TFT, or between the common electrode COM and the electrode connected to the source line SL of the TFT.

The timing controller 102 outputs image data and various control signals necessary for displaying (gate control signals, clock signals and the like) in serial form. In other words, the timing controller 102 plays a role of controlling the timings of the gate-side liquid crystal drive circuit 103 and the source-side liquid crystal drive circuit 104. The source-side liquid crystal drive circuit 104 converts digital image data transmitted from the timing controller 102 into an analogue gradation voltage. The converted gradation voltage is then written to a pixel of the liquid crystal display panel 101 via the source line SL.

The gate-side liquid crystal drive circuit 103 designates the pixel to which a gradation voltage should be written. That is, pulsed scanning signals are supplied from the gate-side liquid crystal drive circuit 103 to each of the gate lines GL. If the scanning signal supplied to the gate line is in the on-level, all of the TFTs connected to the gate line are turned on. The gradation voltage supplied from the source-side liquid crystal drive circuit 104 to the source line SL is supplied to the pixel electrode through the turned-on TFT. Then, when the TFT is turned off by a scanning signal in the off-level, the supplied gradation voltage is retained in the liquid crystal capacitor or the auxiliary capacitor until the scanning signal of the next frame is supplied. Hence, by sequentially supplying scanning signals to the gate lines GL, a predetermined gradation voltage is supplied to every pixel electrode, and an image can be displayed by rewriting the gradation voltages at a frame cycle.

An arrangement of the liquid crystals between a pixel electrode and a common electrode changes according to the difference between a pixel voltage of the pixel electrode and a voltage of the common electrode. This makes it possible to control the transmission amount of light emitted from a backlight (not shown). Each pixel of the liquid crystal panel 101 displays various colors by shades of color corresponding to the transmitted light amount, and color display of any of R, G and B.

Here, an explanation will be given for the source-side liquid crystal drive circuit 104 according to the embodiment with reference to FIGS. 2 and 3. As shown in FIG. 2, the source-side liquid crystal drive circuit 104 according to the embodiment includes a receiver and serial/parallel conversion circuit 105, a shift register circuit 106, a latch circuit 107, a gradation voltage generation circuit 108, a D/A conversion circuit 109, and output switch devices SWout1 to SWout720.

Moreover, as shown in FIG. 3, the D/A conversion circuit 109 of the embodiment includes a most-significant-three-bits decoder 110, least-significant-three-bits decoder 111 and an calculation circuit 112. Voltages Va0 to Va7, and Vb0 to Vb7 generated in the gradation voltage generator circuit 108 are inputted to the most-significant-three-bits decoder 110 and the least-significant-three-bits decoder 111, respectively. The calculation circuit 112 includes an amplifier 103, a first capacitor C1, a second capacitor C2 and five switch devices SW1 to SW5.

The receiver and serial/parallel conversion circuit 105 receives serial image data transmitted from the timing controller 102, and converts the image data into parallel pixel-by-pixel gradation data D00 to D07. The shift register circuit 106 generates, in accordance with clock signals inputted from the timing controller 102, data capture signals to be used in the latch circuit 107, and outputs the signals to the latch circuit 107. The latch circuit 107 retains, in accordance with the data capture signals inputted from the shift register circuit 106, gradation data corresponding to the number of outputs.

The gradation voltage generation circuit 108 generates multiple main voltages corresponding to most significant bits of the inputted gradation data, and multiple sub voltages corresponding to least significant bits thereof. In the present embodiment, the gradation voltage generation circuit 108 generates main voltages Va0 to Va7 corresponding to the most significant three bits of 6-bit digital gradation data, and sub voltages Vb0 to Vb7 corresponding to the least significant three bits. The gradation voltage generation circuit 108 supplies the generated main voltages Va0 to Va7 to the most-significant-three-bits decoder 110, and supplies the sub voltages Vb0 to Vb7 to the least-significant-three-bits decoder 111.

By performing calculation processing on the inputted main voltages, sub voltages and reference voltage, the D/A conversion circuit 109 outputs a gradation voltage corresponding to the gradation data transmitted from the latch circuit 107. To be specific, the most-significant three-bits decoder 110 provided to the D/A conversion circuit 109 selects, according to the most significant three bits of the gradation data inputted from the latch circuit 107, one of the inputted multiple main voltages Va0 to Va7, and supplies the voltage to the calculation circuit 112. Meanwhile, the least-significant-three-bits decoder 111 selects, according to the least significant three bits of the gradation data inputted from the latch circuit 107, one of the inputted multiple sub voltages Vb0 to Vb7, and supplies the voltage to the calculation circuit 112.

The calculation circuit 112 calculates, by use of the main voltage selected by the most-significant three-bits decoder 110, the sub voltage selected by the least-significant-three-bits decoder 111, and reference voltage Vref, and performs output. The output switch devices SWout1 to SWout720 separate the output of the calculation circuit 112 and output terminals OUT1 to OUT720 of the source-side liquid crystal drive circuit 104 for a certain time period, according to control signals inputted from the timing controller 102. The gradation voltage generated on the basis of the gradation data is supplied to each of the pixels of the liquid crystal display panel 101 via the source line SL while the output switch devices SWout1 to SWout720 are turned on.

As shown in FIG. 3, the calculation circuit 112 is provided with the amplifier circuit 113. The reference voltage Vref is inputted to a non-inverting input terminal of the amplifier circuit 113. The reference voltage Vref is assumed to be a voltage equal to Va4 being an intermediate voltage of the main voltages. Moreover, two capacitors C1 and C2 having equal capacity values are provided to the calculation circuit 112. The most-significant three-bits decoder 110 is connected to one end of the first capacitor C1, and an inverting input terminal of the amplifier circuit 113 is connected to the other end of the first capacitor C1. Meanwhile, the least-significant-three-bits decoder 111 is connected to one end of the second capacitor C2, and the inverting input terminal of the amplifier circuit 113 is connected to the other end of the second capacitor C2.

The switch device SW1 is connected between an output terminal of the amplifier circuit 113 and the inverting input terminal thereof. A voltage follower connection is established in the amplifier circuit 113 by turning on the switch device SW1. The switch device SW2 is provided between the most-significant three-bits decoder 110 and the first capacitor C1, and the switch device SW4 is provided between the least-significant-three-bits decoder 111 and the second capacitor C2. Furthermore, the switch device SW3 is provided between the first capacitor C1 and the output terminal of the amplifier circuit 113. The switch device SW5 is provided between the second capacitor C2 and the reference voltage Vref.

Figure 4:
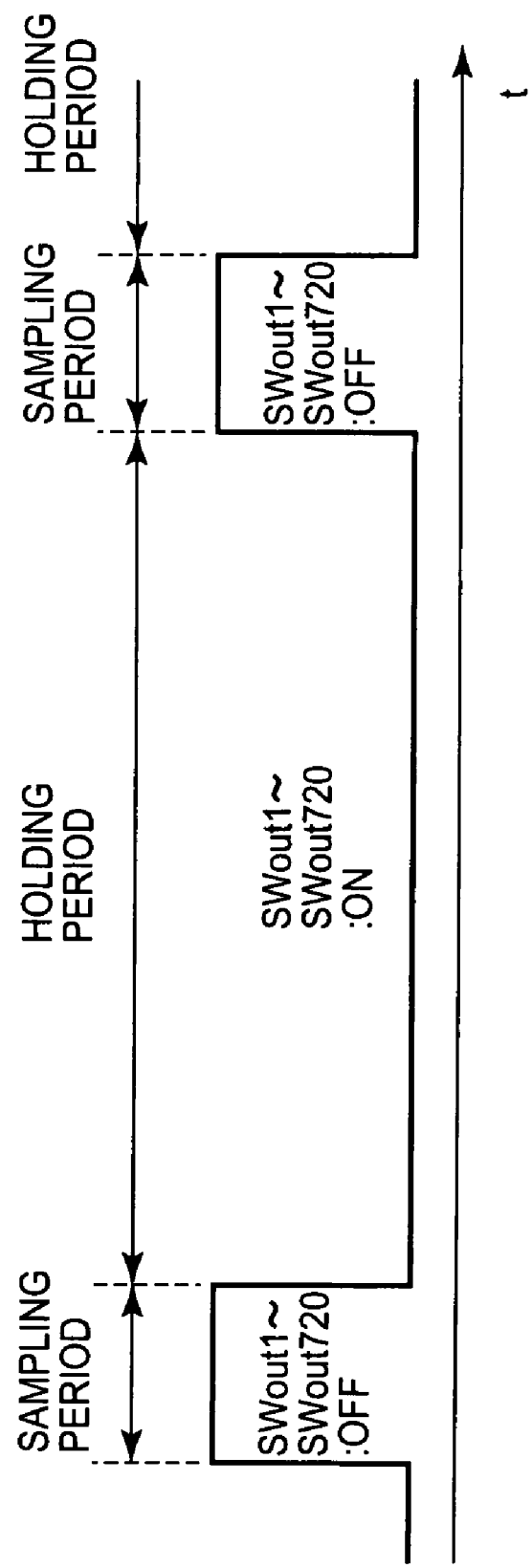
FIG. 4 is a timing chart showing a waveform of a control signal according to the first embodiment.

Here, explanations will be given for an operation of the 6-bit source-side liquid crystal drive circuit 104 according to the embodiment with reference to FIGS. 4 to 9. FIG. 4 is a timing chart illustrating a control signal supplied to output switch devices SWout0 to SWout720 of the source-side liquid crystal drive circuit 104 according to the embodiment. As shown in FIG. 4, the source-side liquid crystal drive circuit 104 requires two periods of a sample period and a hold period for performing D/A conversion. During the sample period, the output switch devices SWout0 to SWout720 are turned off in synchronism with a rise in the control signal. Meanwhile, during the hold period, the output switch devices SWout0 to SWout720 are turned on in synchronism with a fall in the control signal.

FIG. 5 is a diagram showing eight main voltages Va0 to Va7 corresponding to the gradation data of the most significant three bits generated in the gradation voltage generation circuit 108, and eight sub voltages Vb0 to Vb7 corresponding to the gradation data of the least significant three bits. FIG. 6 shows the main voltages respectively selected according to the value of the gradation data of the most significant three bits. FIG. 7 shows the sub voltages selected respectively according to the values of the gradation data of the least significant three bits.

Figure 8:
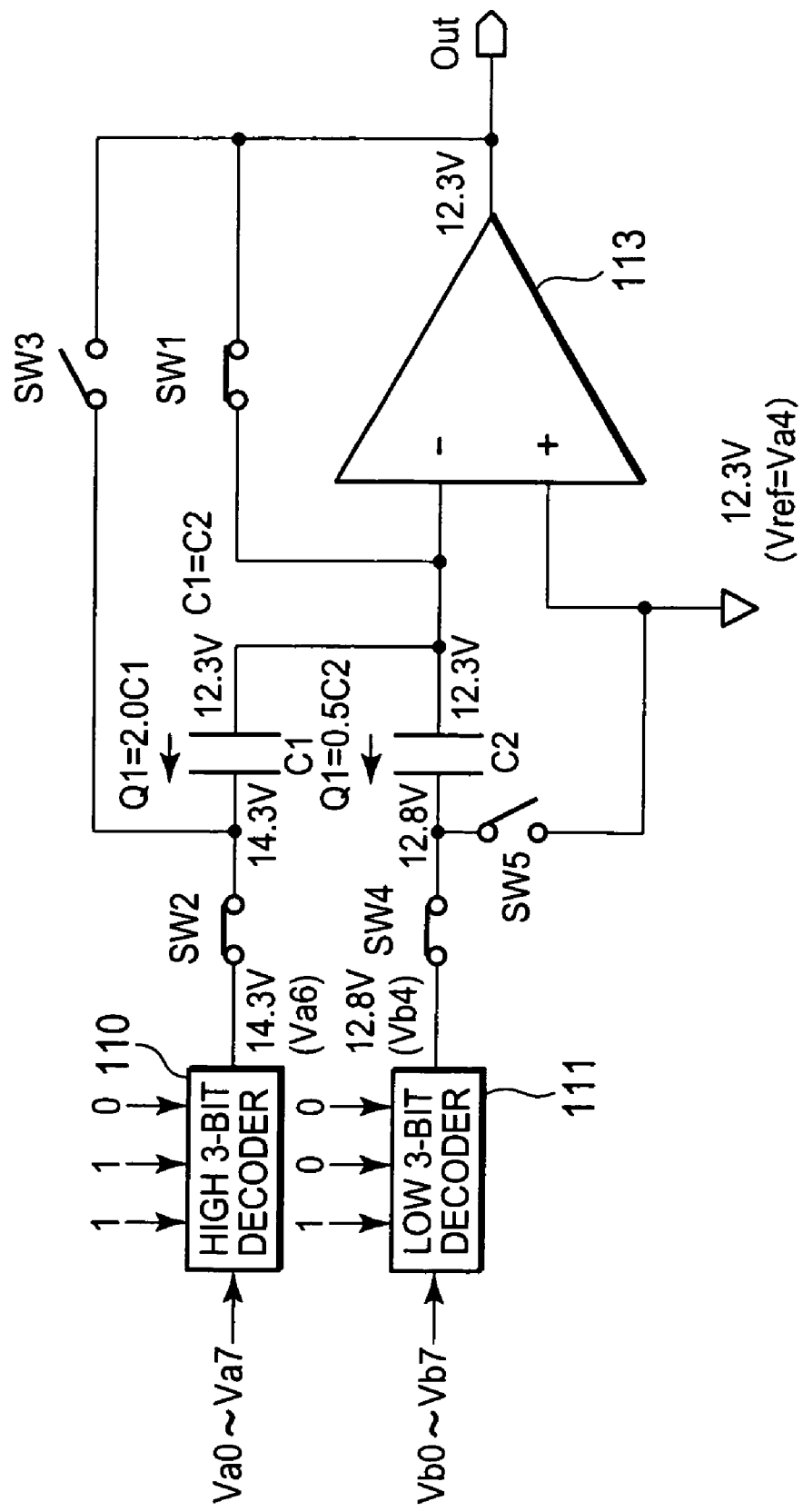
FIG. 8 is a diagram showing a state of switch devices during a sample period in a liquid crystal drive circuit according to the first embodiment.
Figure 9:
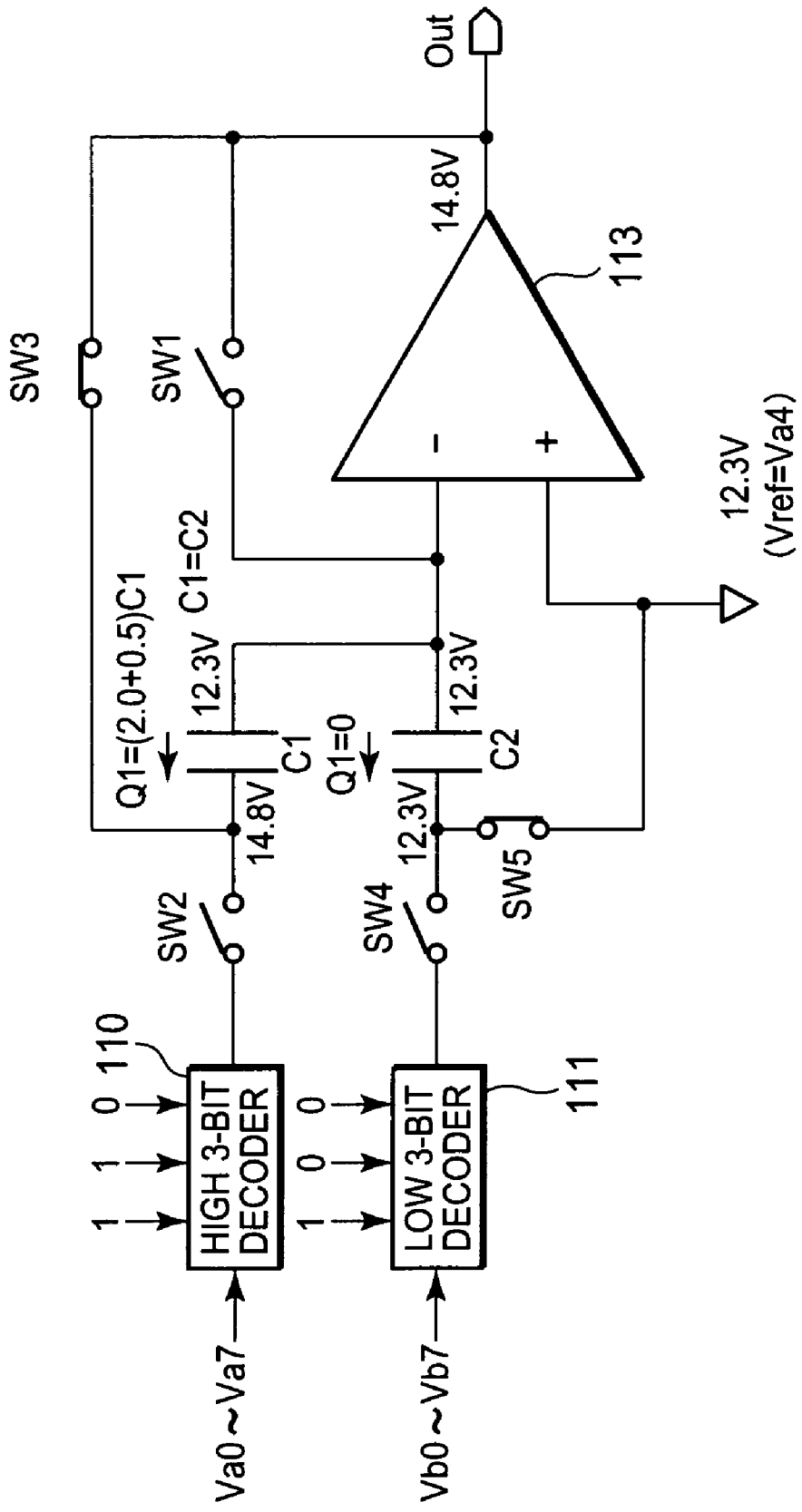
FIG. 9 is a diagram showing a state of switch devices during a hold period in a liquid crystal drive circuit according to the first embodiment.

FIG. 8 shows a state of the switch devices SW1 to SW5 included in the calculation circuit 112, during a sample period. FIG. 9 shows a state of the switch devices SW1 to SW5 included in the calculation circuit 112, during a hold period.

Here, an example is described in which D/A conversion is performed on gradation data of 6-bit binary data (110100). Note that an ideal gradation voltage into which the gradation data of (110100) should be converted is 14.8V. As has been described, 6-bit gradation data is separated into most significant three bits and least significant three bits. Meanwhile, the reference voltage Vref inputted to the non-inverting input terminal of the amplifier circuit 113 is equal to the intermediate voltage Va4 (12.3V) of the main voltages.

As shown in FIG. 4, when the control signal rises during the sample period, the output switch devices SWout1 to SWout720 are turned off. At this time, as shown in FIG. 8, the switch devices SW1, SW2 and SW4 are turned on, while SW3 and SW5 are turned off. Thus, the amplifier circuit 113 forms a voltage follower and outputs the reference voltage Vref (12.3V) inputted to the non-inverting input terminal. Accordingly, the voltages of one end of the first capacitor C1 and that of the second capacitor C2 become the same as the reference voltage Vref (12.3V).

Since the most significant three bits of the gradation data are (110), Va6 (14.3V) selected by the most-significant three-bits decoder 110 is supplied to the other end of the first capacitor C1 (see FIG. 6). Since the least significant three bits of the gradation data are (100), Vb6 (12.8V) selected by the least-significant-three-bits decoder 111 is supplied to the other end of the second capacitor C2 (see FIG. 7). Accordingly, electrical charges indicated by the following equations (1) and (2) are accumulated to the capacitors C1 and C2, respectively.

$$Q1 = (Va6 - Vref) \, C1 \qquad (1)$$
$$= (14.3 - 12.3) \, C1 = 2.01C1$$

$$Q2 = (Vb4 - Vref) \, C2 \qquad (2)$$
$$= (12.8 - 12.3) \, C2 = 0.5C2$$

Then, when the control signal falls during the hold period, the output switch devices SWout1 to SWout720 are turned on. At this time, as shown in FIG. 9, the switch devices SW3 and SW5 are turned on, while SW1, SW2 and SW4 are turned off. Thus, the reference voltage Vref (12.3V) is supplied to the other end of the second capacitor C2. For this reason, the voltage between the terminals of the second capacitor C2 becomes 0V, and the electrical charge Q2 to be accumulated in the second capacitor C2 becomes 0. Moreover, according to the law of conservation of charge, the electrical charge accumulated in the second capacitor C2 during the sample period moves to the first capacitor C1 side. Accordingly, electrical charges indicated by equations (3) and (4) are accumulated in the capacitors C1 and C2, respectively.

$$Q1 = (Va6 - Vref) \, C1 + (Vb4 - Vref) \, C2 \qquad (3)$$
$$= 2.0C1 + 0.5C2$$

$$Q2 = (Vref - Vref) \, C2 = (12.3 - 12.3) \, C2 = 0 \qquad (4)$$

Here, if capacities of the first capacitor C1 and the second capacitor C2 are assumed to be equal (C1=C2) because of absolutely no production variation, the equation (3) can be represented by the following equation (5).

$$Q1 = (Va6 - Vref) \, C1 + (Vb4 - Vref) \, C1 \qquad (5)$$
$$= (2.0 + 0.5) \, C1 = 2.5C1$$

Accordingly, since V=Q/C, the voltage V1 between the terminals of the first capacitor C1 is expressed as follows.

$$V1 = Va6 + Vb4 - 2Vref = 2.5 \qquad (6)$$

Hence, the output Vout of the amplifier circuit 113 is expressed by the following equation.

$$Vout = V1 + Vref \qquad (7)$$
$$= Va6 + Vb4 - Vref$$
$$= 14.3 + 12.8 - 12.3 = 14.8$$

As has been described, according to the present invention, D/A conversion is performed so that the gradation data (110100) is converted into the ideal gradation voltage 14.8V.

Figure 10:
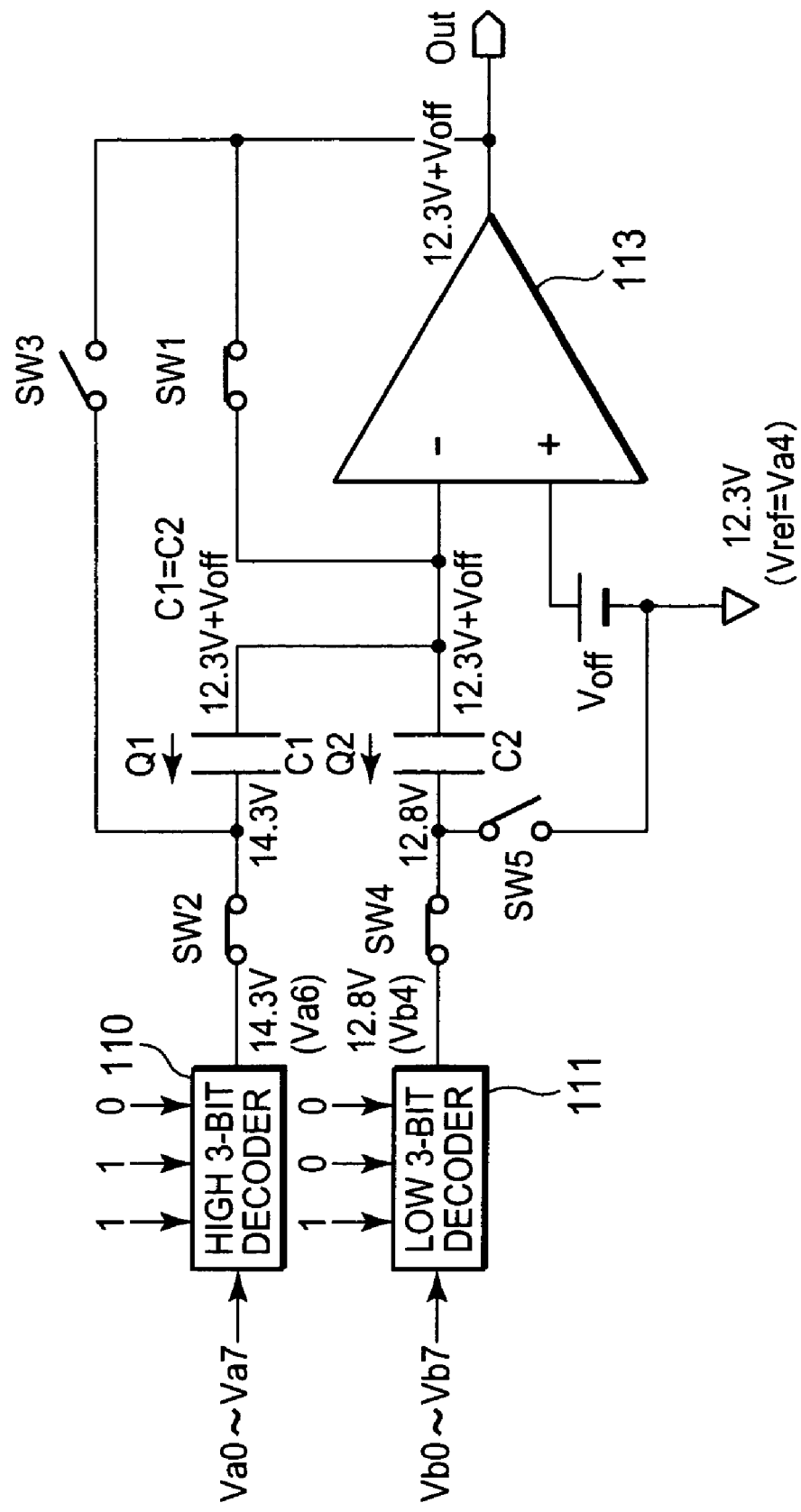
FIG. 10 is a diagram showing a state of switch devices during a sample period in a liquid crystal drive circuit including an offset voltage, according to the first embodiment.
Figure 11:
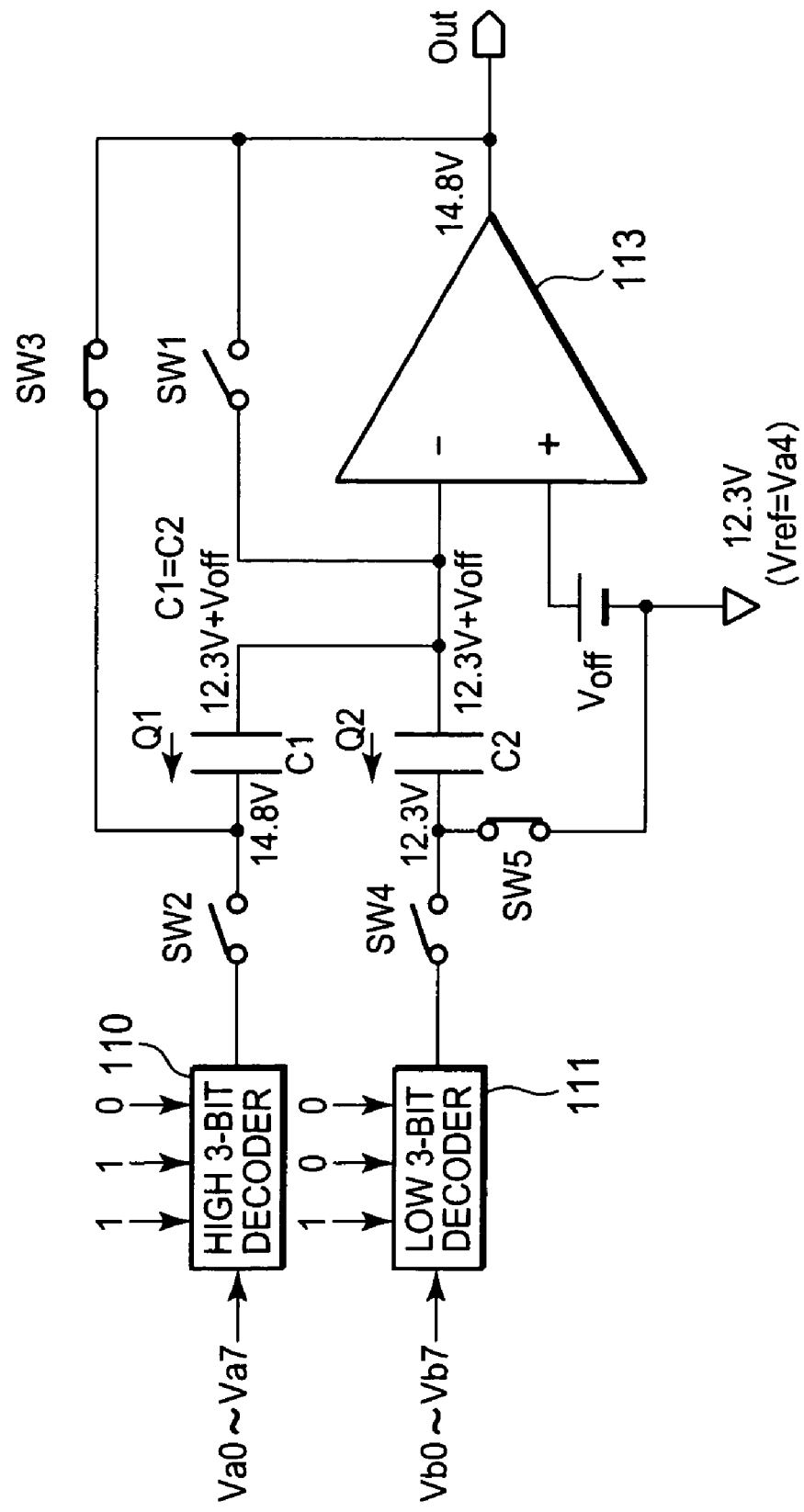
FIG. 11 is a diagram showing a state of switch devices during a hold period in a liquid crystal drive circuit including an offset voltage, according to the first embodiment.

An explanation has been given above for a case where the amplifier circuit 113 does not include an offset voltage. However, even in a case where the amplifier circuit 113 includes an offset voltage, the D/A conversion circuit of the present invention can automatically cancel the offset voltage of the amplifier circuit 113 by the normal operation. Specifically, the D/A conversion circuit monitors the offset voltage of the amplifier circuit 113 by the capacitors C1 and C2 during the sample period, holds the voltage during the hold period, and cancels the voltage on performing output. Hereinbelow, an explanation will be given for a case where the amplifier circuit 113 includes an offset voltage with reference to FIGS. 10 and 11. FIG. 10 shows a state of the switch devices SW1 to SW5 included in the calculation circuit 112, during a sample period. FIG. 11 shows a state of the switch devices SW1 to SW5 included in the calculation circuit 112, during a hold period. The offset voltage of the amplifier circuit 113 is set to be Voff. Note that operations for turning on/off the switch devices SW1 to SW5, and those for the output switch devices SWout1 to SWout720 are the same as the above-mentioned example.

As shown in FIG. 4, when the control signal rises and a sample period, the output switch devices SWout1 to SWout720 are turned off. At this time, as shown in FIG. 10, the switch devices SW1, SW2 and SW4 are turned on, wile SW3 and SW5 are turned off. In a case where the amplifier circuit 113 includes an offset voltage, reference voltage Vref+Voff (12.3+VoffV) is outputted from the output terminal of the amplifier circuit 113 during the sample period. Accordingly, the voltages of one end of the first capacitor C1 and that of the second capacitor C2 become the same as the reference voltage Vref+Voff (12.3+VoffV).

Since the most significant three bits of the gradation data are (110), Va6 (14.3V) selected by the most-significant three-bits decoder 110 is supplied to the other end of the first capacitor C1 (see FIG. 6). Since the least significant three bits of the gradation data are (100), Vb6 (12.8V) selected by the least-significant-three-bits decoder 111 is supplied to the other end of the second capacitor C2 (see FIG. 7). Accordingly, electrical charges indicated by the following equations (8) and (9) are accumulated to the capacitors C1 and C2, respectively.

$$Q1 = \{Va6 - (Vref + Voff)\} \, C1 \qquad (8)$$
$$= (14.3 - 12.3 - Voff) \, C1 = (2.0 - Voff) \, C1$$

$$Q2 = \{Vb4 - (Vref + Voff)\} \, C2 \qquad (9)$$
$$= (12.8 - 12.3 - Voff) \, C2 = (0.5 - Voff)$$

Then, when the control signal falls for a hold period, the output switch devices SWout1 to SWout720 are turned on. At this time, as shown in FIG. 11, switch devices SW3 and SW5 are turned on, while SW1, SW2 and SW4 are turned off. Thus, the reference voltage Vref (12.3V) is supplied to the other end of the second capacitor C2. For this reason, the voltage between the terminals of the second capacitor C2 becomes −Voff and the electrical charge Q2 to be accumulated in the second capacitor C2 becomes −VoffC2. Moreover, according to the law of conservation of charge, the remaining electrical charge accumulated in the second capacitor C2 during the sample period moves to the first capacitor C1 side. Accordingly, electrical charges indicated by equations (10) and (11) are accumulated in the capacitors C1 and C2, respectively.

$$Q1 = \{(Va6 - (Vref + Voff))\,C1 + (Vb4 - Vref)\,C2 \quad (10)$$
$$= (2.0 - Voff)\,C1 + 0.5C2$$

$$Q2 = \{(Vref - (Vref + Voff))\,C2 \quad (11)$$
$$= (12.3 - 12.3 - Voff)\,C2 = -VoffC2$$

Here, if capacities of the first capacitor C1 and the second capacitor C2 are assumed to be equal (C1=C2) because of absolutely no production variation, the equation (10) can be represented by the following equation (12).

$$Q1 = (Va6 + Vb4 - 2Vref - Voff)\,C1 \quad (12)$$
$$= (2.0 + 0.5 - \text{off})\,C1 = (2.5 - Voff)\,C1$$

Accordingly, since V=Q/C, the voltage V1 between the terminals of the first capacitor C1 is expressed as follows.

$$V1 = Va6 + Vb4 - 2Vref - Voff = 2.5 - Voff \quad (13)$$

Hence, the output Vout of the amplifier circuit 113 is expressed by the following equation.

$$Vout = V1 + Vref + Voff \quad (14)$$
$$= Va6 + Vb4 - Vref$$
$$= 14.3 + 12.8 - 12.3 = 14.8$$

As has been described, according to the present invention, the offset voltage Voff of the amplifier circuit 113 is cancelled completely. In addition, D/A conversion is performed so that the gradation data (110100) is converted into the ideal gradation voltage 14.8V.

By performing calculation on the main voltages corresponding to the most significant three bits and the sub voltages corresponding to the least significant three bits in the calculation circuit 112 through the operation as described above, 64 voltages shown in FIG. 12 can be obtained. That is, in the present invention, 2 (m+k) voltages can be obtained by performing calculation with the calculation means on the main voltages corresponding to most significant m bits and sub voltages corresponding to least significant k bits.

FIG. 13 shows the area of decoder circuits and number of gradation lines corresponding to the number of bits. The area of a decoder circuit can be reduced by thus separating the decoder circuit for most significant bits and least significant bits. In addition, the number of required gradation lines can be reduced. If the number of most significant bits and the least significant bits are made to be the same (m=k) in a case of a 12-bit liquid crystal drive circuit, the area of the decoder circuit is as large as 7 bits (two 6-bit decoders), and the required number of gradation lines is 128. Accordingly, in the case of a 12-bit decoder, the area of the decoder circuit can be reduced to 1/12 (1/32 of the normal case of not separating data into most significant and least significant bits) of that in a conventional technique. In addition, the required number of gradation lines can be reduced to 1/8 (1/32 of the normal case) of the conventional technique.

In a case of a 14-bit liquid crystal drive circuit, the area of the decoder circuit is as large as 8 bits (two 7-bit decoders), and the required number of gradation lines is 256. Accordingly, in the case of a 14-bit decoder, the area of the decoder circuit can be reduced to 1/24 (1/64 of the normal case of not separating data into most significant and least significant bits) of that in a conventional technique. In addition, the required number of gradation lines can be reduced to 1/16 (1/64 of the normal case) of the conventional technique. Thus, the chip area can be reduced to a large extent even in the case of a multi-bit liquid crystal drive circuit, leading to a reduction in costs.

Moreover, in the present invention, it suffices to provide two capacitors of the same capacity value and the two capacity values need not be in set a ratio relationship. For this reason, relative accuracy between the capacitors is more easily maintained, and less deviation occurs in the outputted voltages as compared to the conventional technique where the capacity values need to be in a ratio relationship. Further, the capacitor is capable of storing the offset voltage Voff of the amplifier circuit 113. For this reason, by subtracting the stored offset voltage Voff from the voltage to be outputted from the amplifier circuit 113, the offset voltage of the amplifier circuit 113 can be cancelled effectively. Thus, a high-precision D/A conversion circuit that is not affected by production variation can be fabricated.

Second Embodiment

Figure 14:
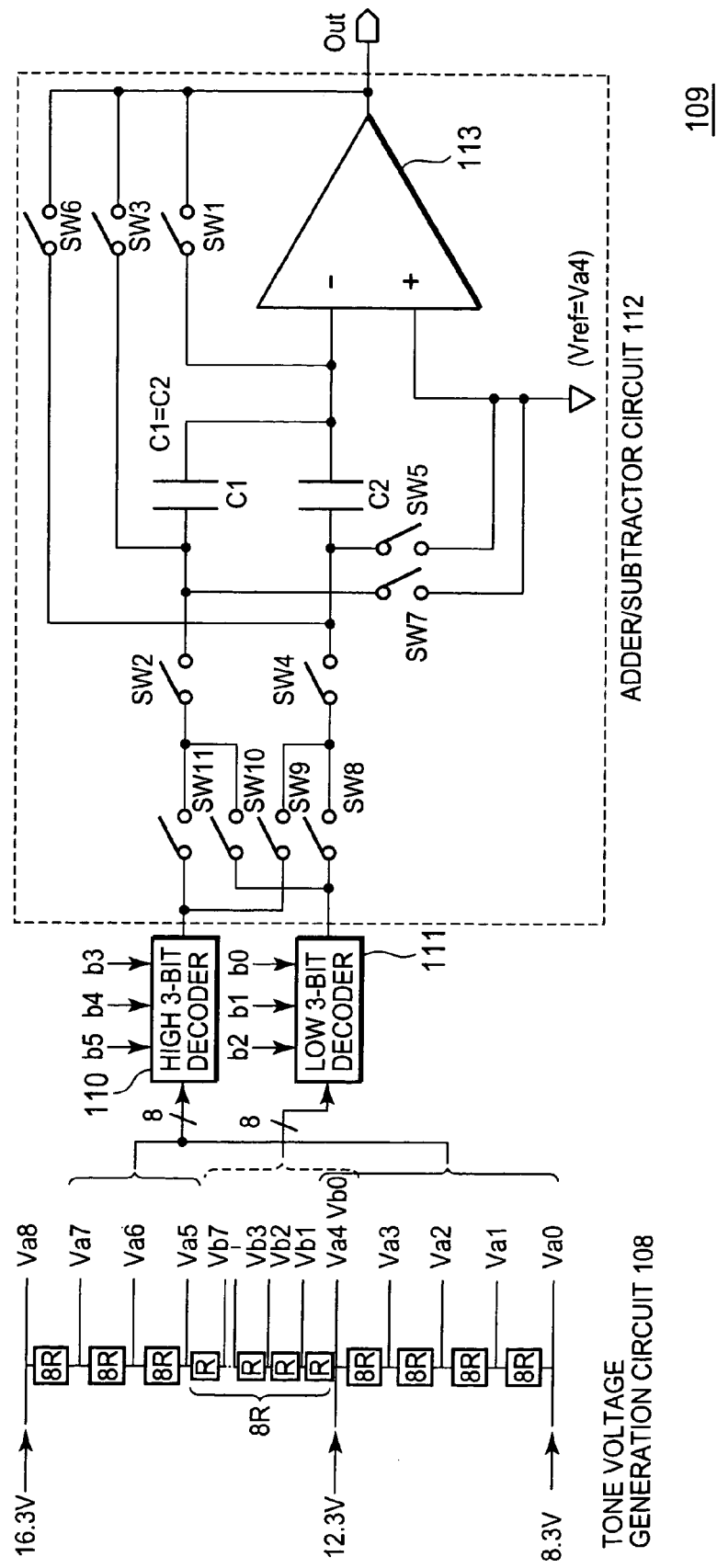
FIG. 14 is a diagram showing a configuration of a D/A conversion circuit according to a second exemplary embodiment.

An explanation will be given for a D/A conversion circuit according to a second embodiment of the present invention with reference to FIG. 14. FIG. 14 is a diagram showing a configuration of the D/A conversion circuit according to the embodiment. The configuration of the D/A conversion circuit of the embodiment includes six switch devices SW6 to SW11 in addition to the DA converter of the first embodiment. The switch devices SW6 to SW11 are switching units for alternately switching the first capacitor and the second capacitor at every predetermined cycle.

As shown in FIG. 14, the switch device SW11 is connected between the most-significant-three-bits decoder 110 and the switch device SW2. Then, the switch device SW10 is connected between the least-significant-three-bits decoder 111 and the switch device SW2. The switch device SW8 is connected between the least-significant-three-bits decoder 111 and the switch device SW4. The switch device SW9 is connected between the most-significant-three-bits decoder 110 and the switch device SW4.

The switch device SW11 controls the connection state between the most-significant-three-bits decoder 110 and the first capacitor C1, and the switch device SW8 controls the connection state between the least-significant-three-bits decoder 111 and the second capacitor C2. Meanwhile, the switch device SW9 controls the connection state between the most-significant-three-bits decoder 110 and the second capacitor C2, and the switch device SW10 controls the connection state between the least-significant-three-bits decoder 111 and the first capacitor C1.

In the D/A conversion circuit according to the exemplary embodiment, a first connection state and a second connection state are alternately repeated by controlling the on/off of the switch devices SW8 to SW11. Specifically, the most-significant-three-bits decoder 110 and the first capacitor C1 are connected, and the least-significant-three-bits decoder 111 and the second capacitor C2 are connected in the first connection state. Meanwhile, the most-significant-three-bits decoder 111 and the second capacitor C2 are connected, and the least-significant-three-bits decoder 111 and the first capacitor C1 are connected in the second connection state.

As similar to the first exemplary embodiment, a switch device SW1 is connected between an output terminal of an amplifier circuit 113 and an inverting input terminal thereof. A voltage follower connection is established in the amplifier circuit 113 by turning on the switch device SW1. A switch device SW2 is provided between the most-significant-three-bits decoder 110 and the first capacitor C1, and a switch device SW4 is provided between the least-significant-three-bits decoder 111 and the second capacitor C2. Furthermore, a switch device SW3 is provided between the first capacitor C1 and the output terminal of the amplifier circuit 113. A switch device SW5 is provided between the second capacitor C2 and a reference voltage Vref.

In addition, as shown in FIG. 14, a switch device SW6 is provided between the output terminal of the amplifier circuit 113 and the second capacitor C2. Meanwhile, a switch device SW7 is provided between the second capacitor C2 and the reference voltage Vref.

Figure 15:
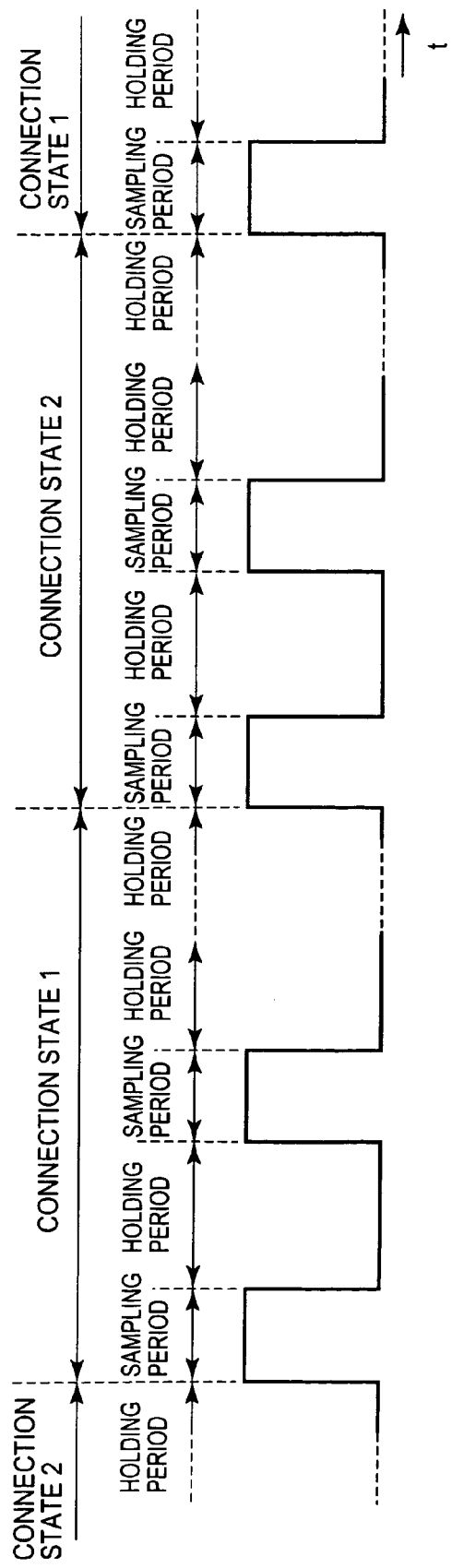
FIG. 15 is a timing chart for explaining an operation of the D/A conversion circuit according to the second embodiment.
Figure 16:
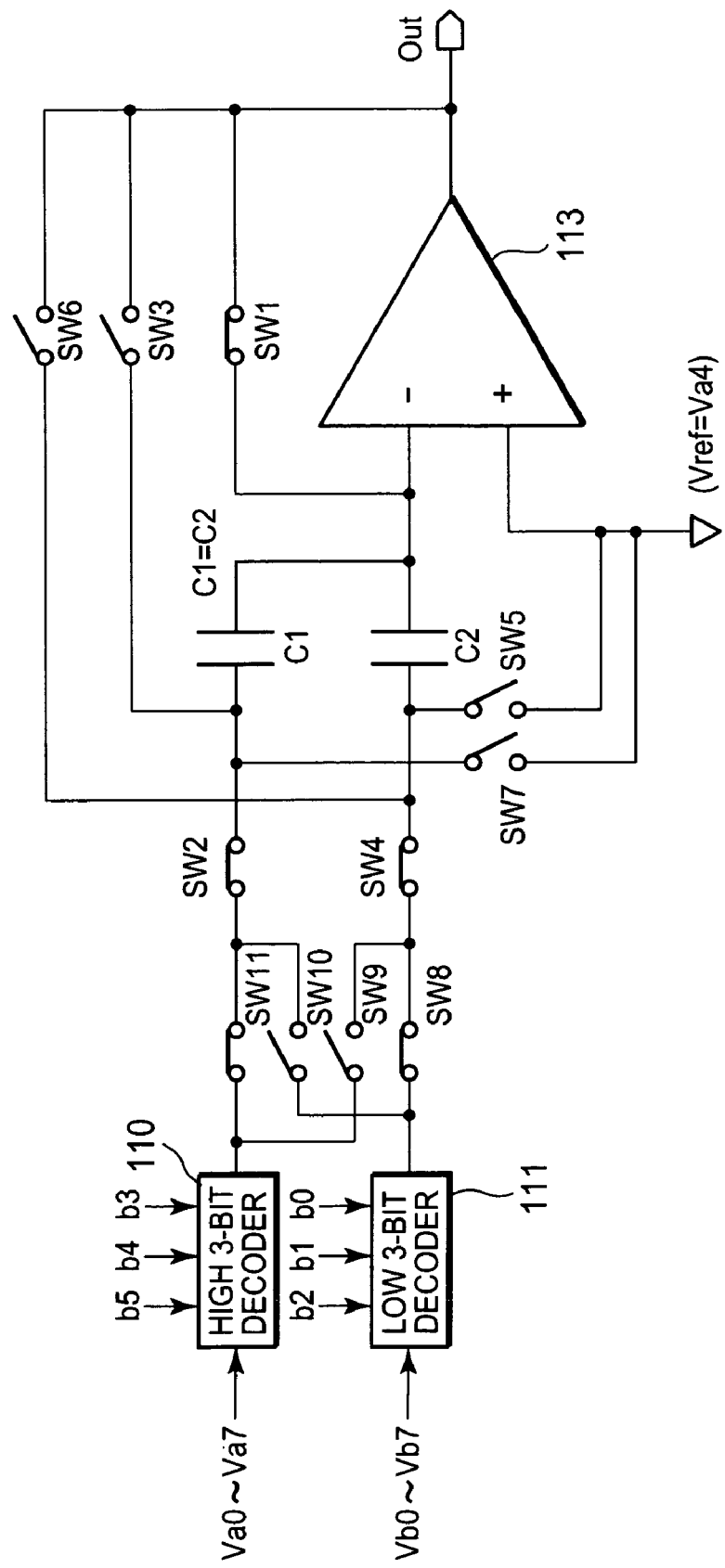
FIG. 16 is a diagram showing a state of switch devices during a sample period in a first connection state in a liquid crystal drive circuit according to the second embodiment.
Figure 17:
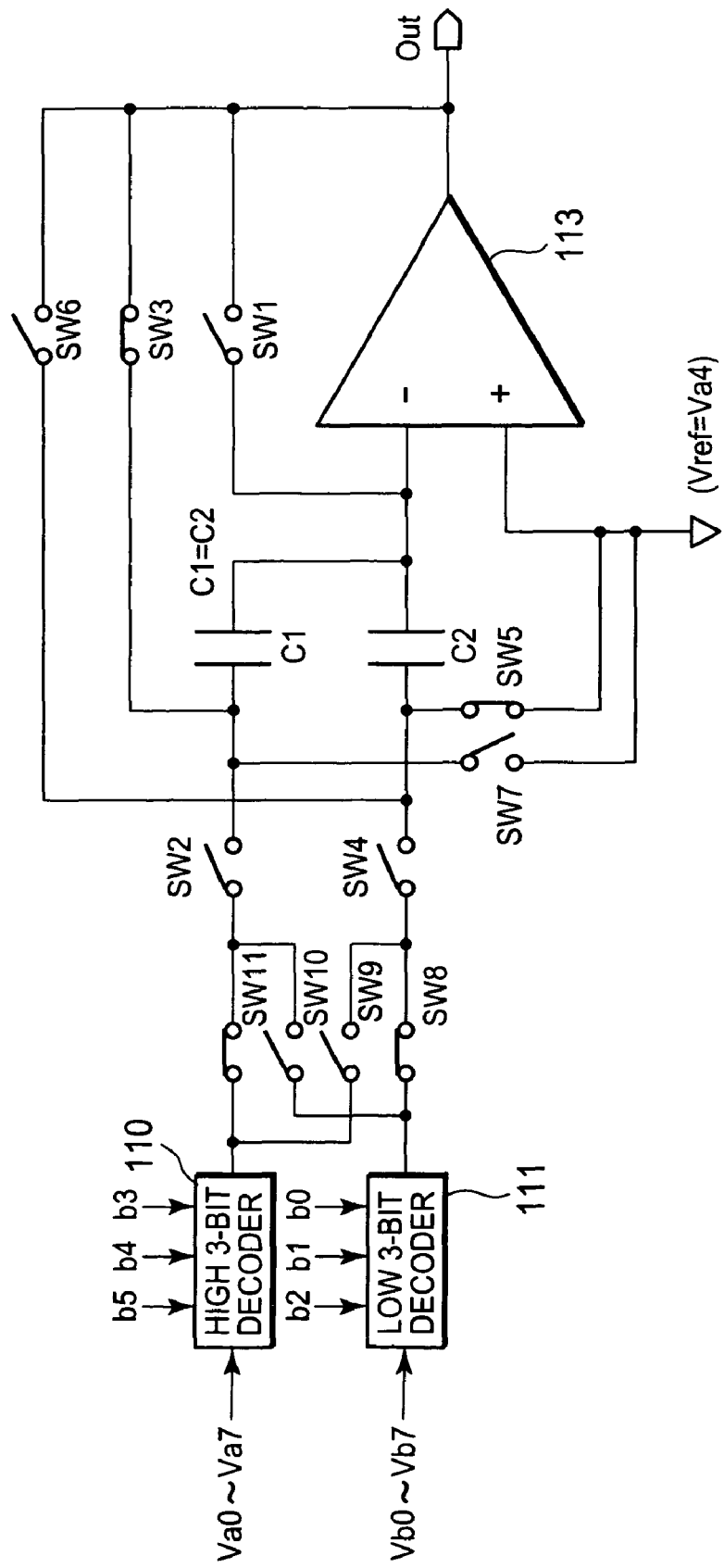
FIG. 17 is a diagram showing a state of switch devices during a hold period in the first connection state in a liquid crystal drive circuit according to the second embodiment.
Figure 18:
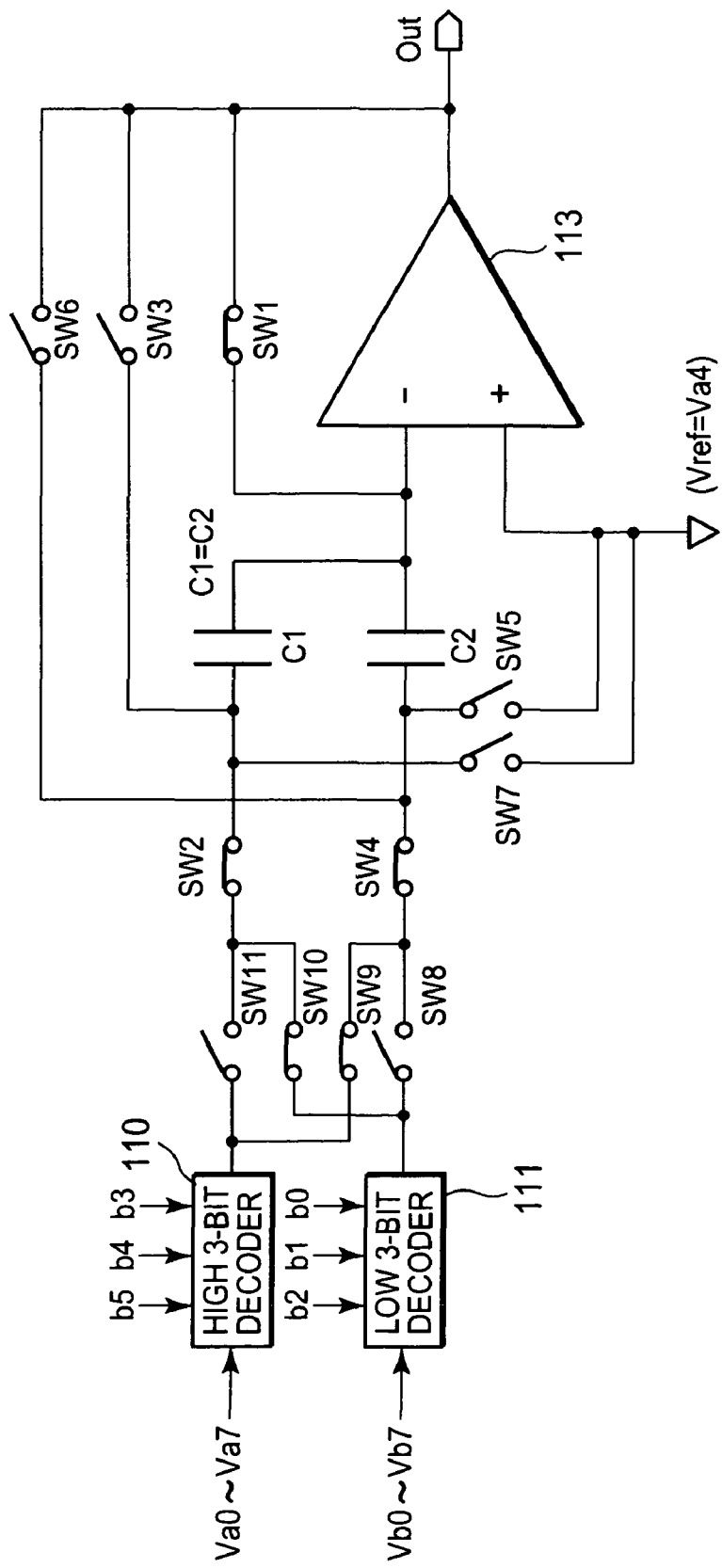
FIG. 18 is a diagram showing a state of switch devices during a sample period in a second connection state in a liquid crystal drive circuit according to a third exemplary embodiment.
Figure 19:
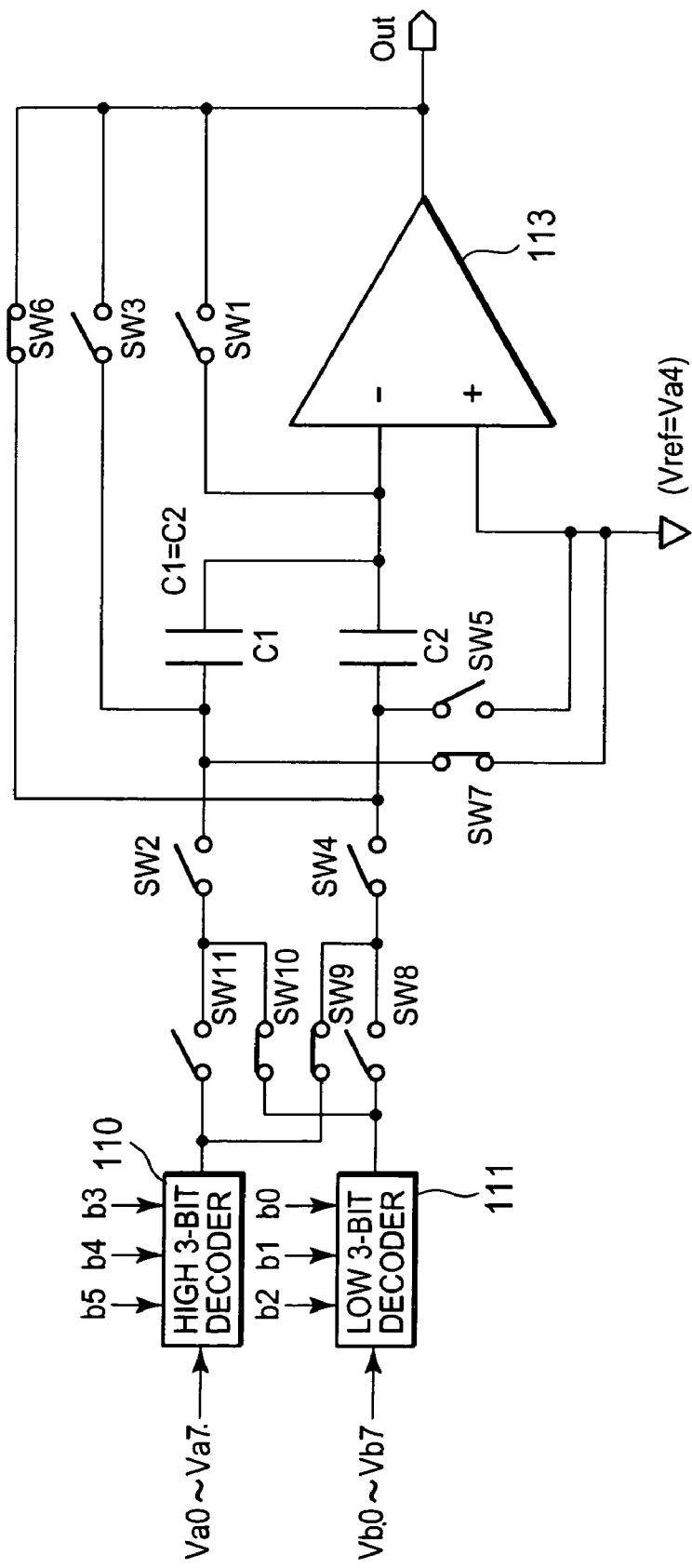
FIG. 19 is a state of switch devices during a hold period in the second connection state in a liquid crystal drive circuit according to the third embodiment.

Here, an explanation is given for an operation of the D/A conversion circuit according to the second exemplary embodiment with reference to FIGS. 15 to 19. FIG. 15 is a timing chart for explaining an operation of the D/A conversion circuit of the embodiment. FIG. 16 shows a state of the switch devices SW1 to SW11 during a sample period in the first connection state, and FIG. 17 shows the state during a hold period. Meanwhile, FIG. 18 shows a state of the switch devices SW1 to SW11 during a sample state in the second connection state, and FIG. 19 shows the state during a hold period.

The D/A conversion circuit of the exemplary embodiment alternately switches between the first connection state and the second connection state at a predetermined cycle. As shown in FIGS. 16 and 17, in the first connection state, the switch devices SW6, SW7, SW9 and SW10 are always turned off, while the switch devices SW8 and SW11 are always turned on. That is, as in the first exemplary embodiment, the first capacitor C1 is connected to the most-significant-three-bits decoder 110 by turning on the switch device SW2. The second capacitor C2 is connected to the least-significant-three-bits decoder 111 by turning on the switch device SW4. As shown in FIGS. 18 and 19, in the second connection state, the switch devices SW3, SW5, SW8 and SW11 are always turned off, while the switch devices SW9 and SW10 are always turned on. That is, unlike the first embodiment, the first capacitor C1 is connected to the least-significant-three-bits decoder 111 by turning on the switch device SW2. The second capacitor C2 is connected to the most-significant-three-bits decoder 110 by turning on the switch device SW4.

An explanation will be given for a case where the capacity value of the second capacitor C2 is a value $\Delta C$ larger than the first capacitor C1 due to production variation, that is, a case where $C2=C1+\Delta C$ is true. Note that the explanation will be given for an example of performing D/A conversion on gradation data of 6-bit binary data (110100) as similar to the first embodiment. Operations of the switch devices SW1 to SW5 in the first connection state are the same as those in the first embodiment, and therefore explanations thereof will be omitted.

Given the above equation (3), electrical charges to be accumulated in the first capacitor C1 during the hold period in the first connection state are expressed as follows.

$$Q1 = 2.0C1 + 0.5C2 \quad (15)$$
$$= 2.0C1 + 0.2(C1 + \Delta C)$$
$$= 2.5C1 + 0.5\Delta C$$

Accordingly, the voltage between the terminals of the first capacitor C1 is as follows.

$$V1 = Q1/C1 = 2.5 + 0.5\Delta C/C1 \quad (16)$$

As compared to an ideal state, the error voltage in this case is $0.5\Delta C/C1$. With a 10% variation in the capacity values of a capacitor, for example, the error voltage becomes as large as 50 mV. The amount of error varies among outputs, among chips or among wafers, and thus sometimes the error is recognized as a color irregularity when displayed on the liquid crystal display panel 101. To compensate for this problem, the effective value of error is reduced by alternately replacing the first and second connection states at a predetermined cycle to average the error over time.

As mentioned above, in the second connection state, the switch devices SW3, SW5, SW8 and SW11 are always turned off, while the switch devices SW9 and SW10 are always turned on. When the control signal rises during a sample period in the second connection state as shown in FIG. 15, the switch devices SW1, SW2 and SW4 are turned on, while SW6 and SW7 are turned off as shown in FIG. 18. Thus, the amplifier circuit 113 forms a voltage follower and outputs a reference voltage Vref (12.3V) inputted to the non-inverting input terminal. Accordingly, the voltages of one end of the first capacitor C1 and that of the second capacitor C2 become the same as the reference voltage Vref (12.3V).

Since the most significant three bits of the gradation data are (110), Va6 (14.3V) selected by the most-significant-three-bits decoder 110 is supplied to the other end of the second capacitor C2 (see FIG. 6). Since the least significant three bits of the gradation data are (100), Vb6 (12.8V) selected by the least-significant-three-bits decoder is supplied to the other end of the first capacitor C1 (see FIG. 7). Accordingly, electrical charges indicated by the following equations (17) and (18) are accumulated to the capacitors C1 and C2, respectively.

$$Q1 = (12.8 - 12.3)C1 = 0.5C1 \quad (17)$$

$$Q2 = (14.3 - 12.3)C2 = 2.0C2 \quad (18)$$

Then, when the control signal falls during the hold period, the output switch devices SWout1 to SWout720 are turned on. At this time, as shown in FIG. 19, the switch devices SW6 and SW7 are turned on, while SW1, SW2 and SW4 are turned off. Thus, the reference voltage Vref (12.3V) is supplied to the other end of the first capacitor C1. For this reason, the voltage between the terminals of the first capacitor C1 becomes 0V, and the electrical charge Q1 to be accumulated in the first capacitor C1 becomes 0. Moreover, according to the law of conservation of charge, the electrical charge accumulated in the first capacitor C1 during the sample period moves to the second capacitor C2 side. Accordingly, electrical charges indicated by equations (19) and (20) are accumulated in the capacitors C1 and C2, respectively.

$$Q1 = (12.3 - 12.3)C1 = 0 \quad (19)$$

$$Q2 = 2.0C2 + 0.5C1 \quad (20)$$

Here, by substituting $C1=C2-\Delta C$ into equation (20), the following equation is obtained.

$$Q2 = 2.0C2 + 0.5(C2 - \Delta C) \quad (21)$$
$$= 2.5C2 - 0.5\Delta C$$

Accordingly, the voltage between terminals of the second capacitor C2 is $$V2 = Q2/C2 = 2.5 - 0.5\Delta C/C2 \quad (22),$$

and $-0.5\Delta C/C2$ is obtained as an error voltage as compared to the ideal state.

Here, when the first and second connection states are alternately repeated at a predetermined interval and averaged over time, given the equations (16) and (22), the error of the outputted voltage Verror is expressed as follows.

$$Verror = 1/2\,(0.5\Delta C/C1 - 0.5\Delta C/C2) \quad (23)$$
$$= \Delta C/2(1/C1 - 1/C2)0.5$$

With a 10% variation in the capacity values of a capacitor, for example, an error voltage 1.9 mV is obtained from the equation (23). Consequently, according to the D/A conversion circuit of the embodiment, the error amount is largely reduced from the error voltage 50 mV when only the first connection state is used. Hence, the D/A conversion circuit according to the second embodiment is capable of reducing the effective value of error by alternately repeating the first and second connection states at a predetermined cycle to average the error over time. For this reason, even when capacity values vary between the first capacitor C1 and the second capacitor C2, the errors among outputted voltages can be compensated, leading to reduction of color irregularity for display on a panel.

Third Embodiment

Figure 20:
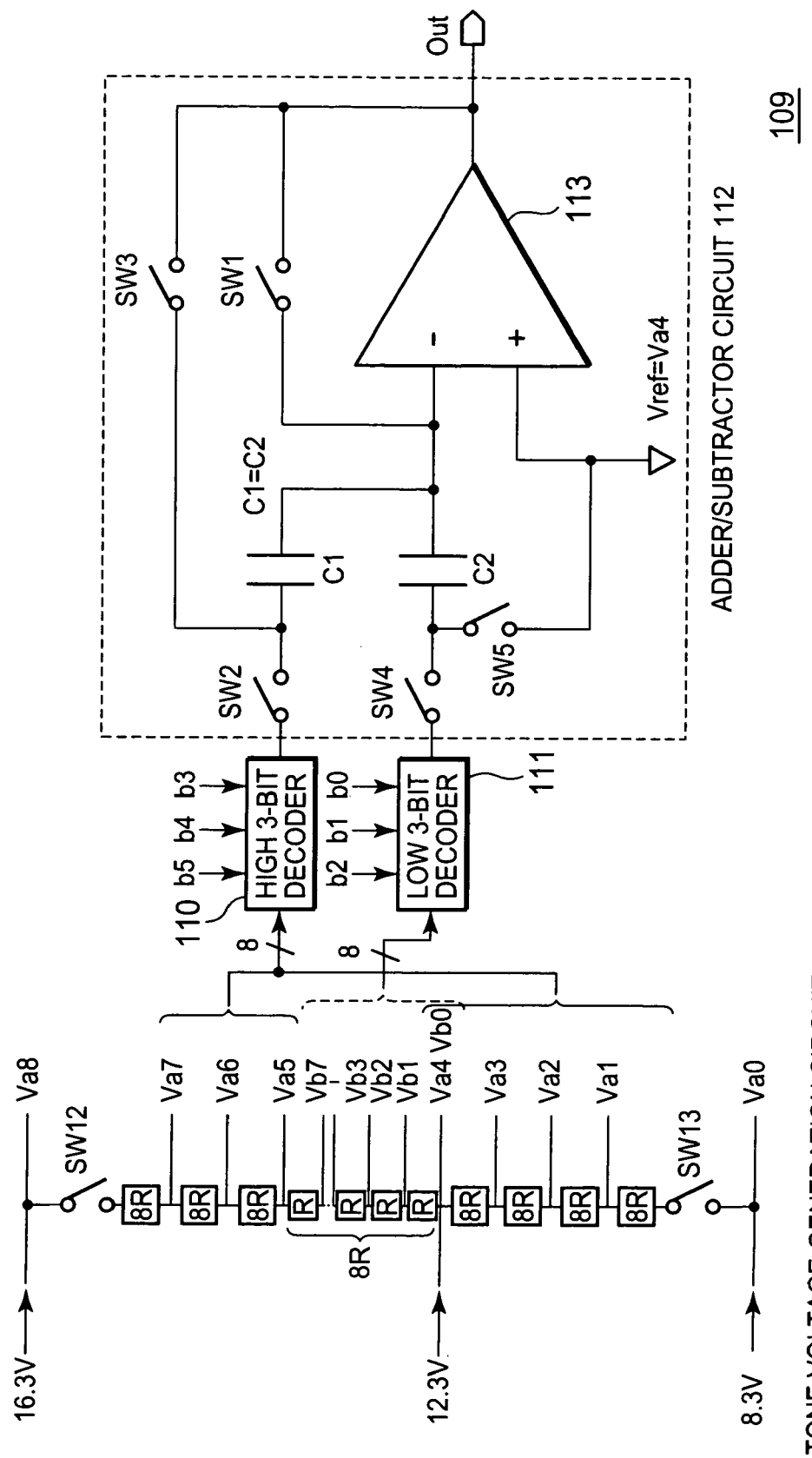
FIG. 20 is a diagram showing a configuration of a D/A conversion circuit according to a third embodiment.
Figure 21:
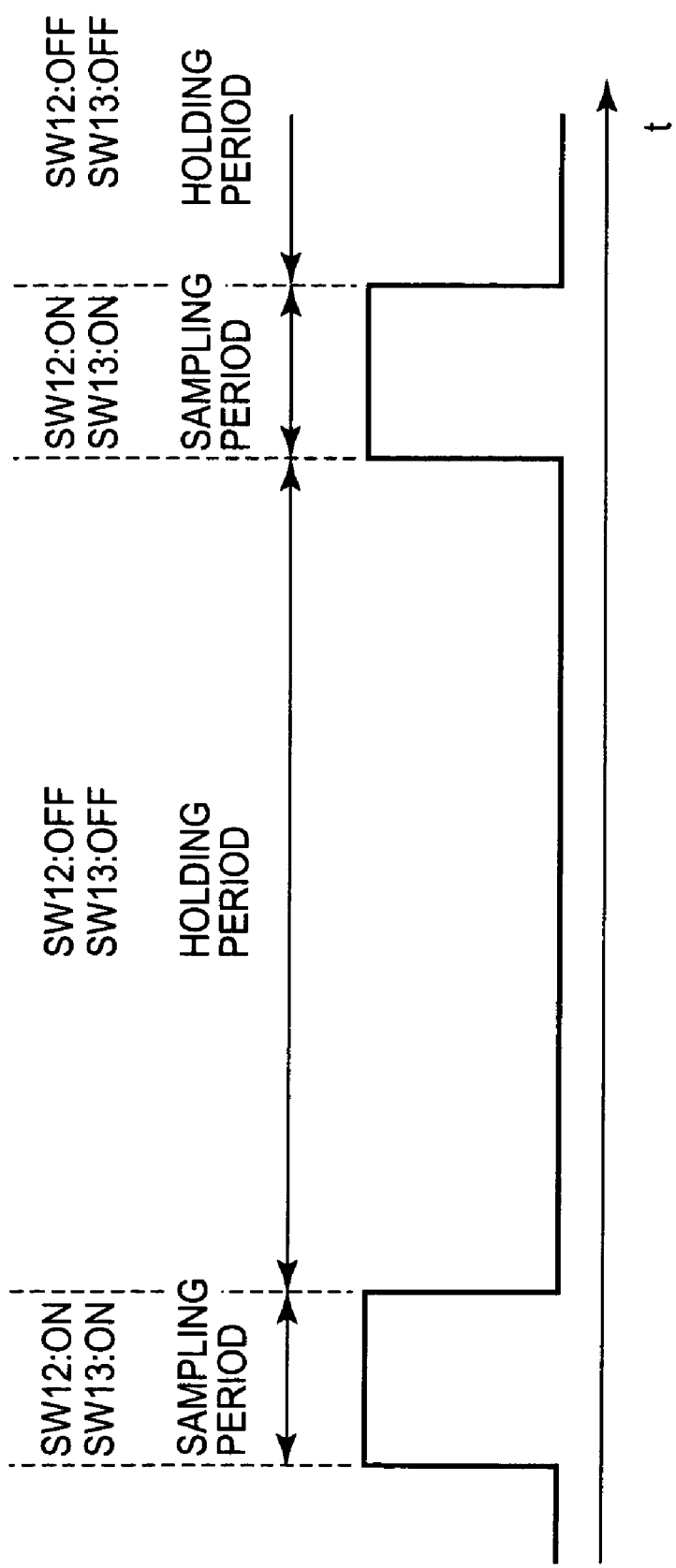
FIG. 21 is a timing chart for explaining an operation of the D/A conversion circuit according to the third embodiment.
Figure 22:
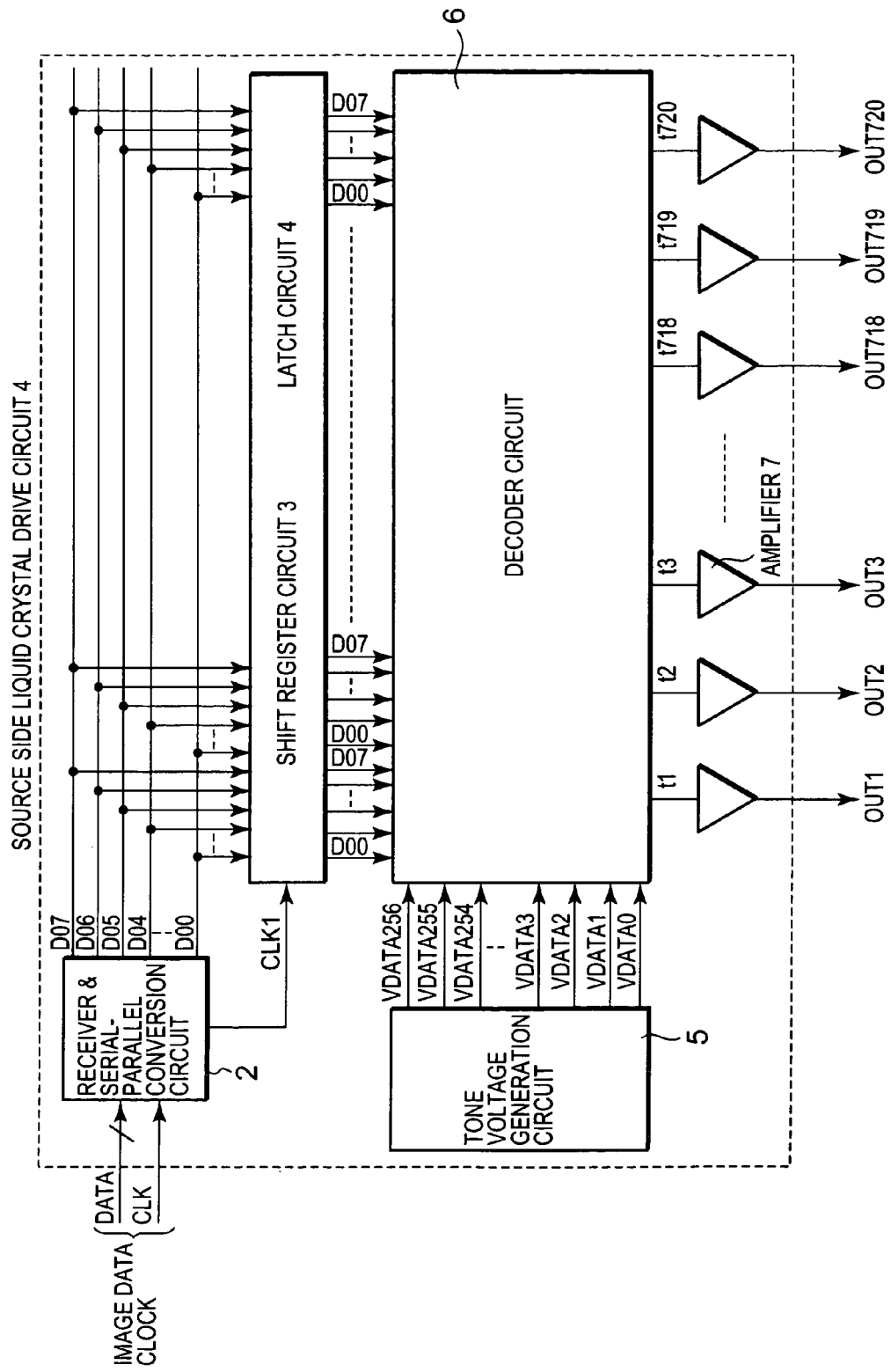
FIG. 22 is a diagram showing a configuration of a liquid crystal drive circuit of a related art.
Figure 23:
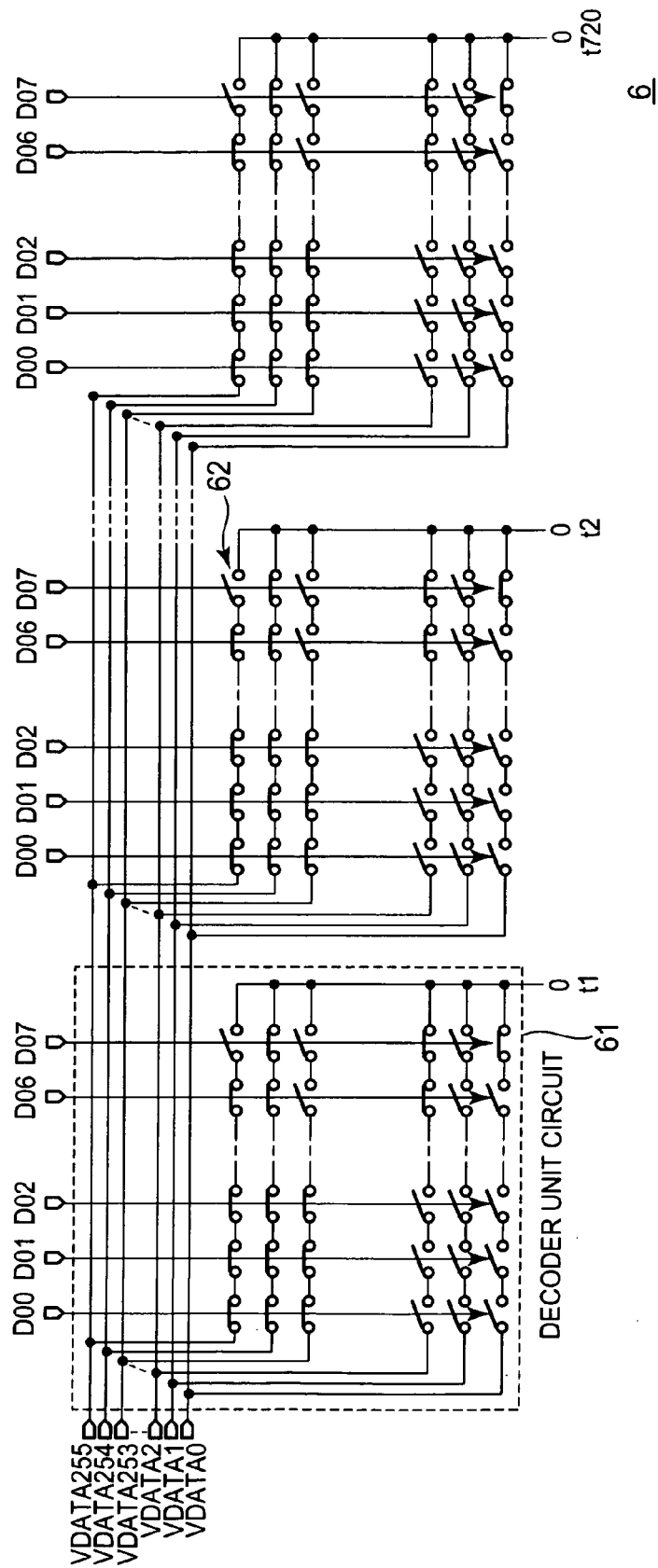
FIG. 23 is a diagram showing a configuration of a decoder circuit of a related; a FIG. 24 is a diagram showing a configuration of a conventional D/A conversion circuit.
Figure 24:
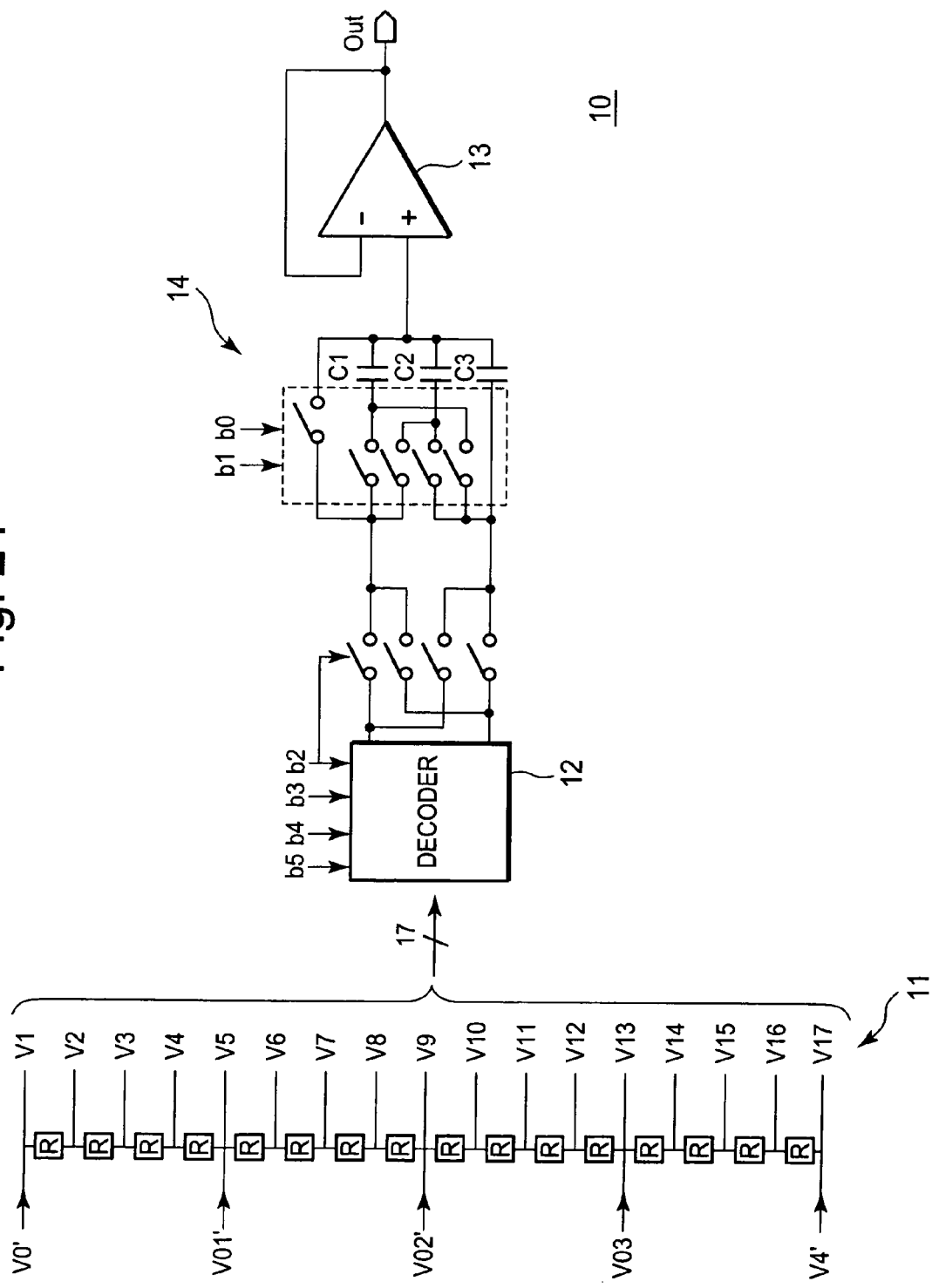

An explanation will be given for a D/A conversion circuit according to a third exemplary embodiment with reference to FIGS. 20 and 21. FIG. 20 is a diagram showing a configuration of the D/A conversion circuit according to the embodiment. FIG. 21 is a timing chart for explaining an operation of the D/A conversion circuit according to the embodiment. The configuration of the D/A conversion circuit of the embodiment includes switch devices SW12 and SW13 for switching active/inactive of the gradation voltage generation circuit 108, in addition to the configuration of the first embodiment. The switch devices SW12 and SW13 are active state controllers that control active/inactive states of the gradation voltage generation circuit 108. Incidentally, since operations of the switch devices SW1 to SW5 are the same as those in the first embodiment, explanations thereof are omitted.

As shown in FIG. 21, during a sample period, the gradation voltage generation circuit 108 is activated by turning on the switch devices SW12 and SW13. Meanwhile, during a hold period, the gradation voltage generation circuit 108 is inactivated by turning off the switch devices SW12 and SW13 because the gradation voltages need not be generated. In this way, excessive use of electricity can be reduced, leading to less power consumption.

As has been described, the present invention can reduce a chip area to a large extent and lower the costs, even for multi-bit liquid crystal drive circuits. In addition, a high-precision D/A conversion circuit that is not affected by production variation can be fabricated. Moreover, even in a case where capacity values vary between a first capacitor C1 and a second capacitor C2, an error in outputted voltages can be compensated by alternately switching between the first capacitor C1 and the second capacitor C2. This results in reducing color irregularity when displaying an image on a panel. Less power consumption can also be aimed for by switching active/inactive of the gradation voltage generation circuit.

Fourth Embodiment

Figure 25:
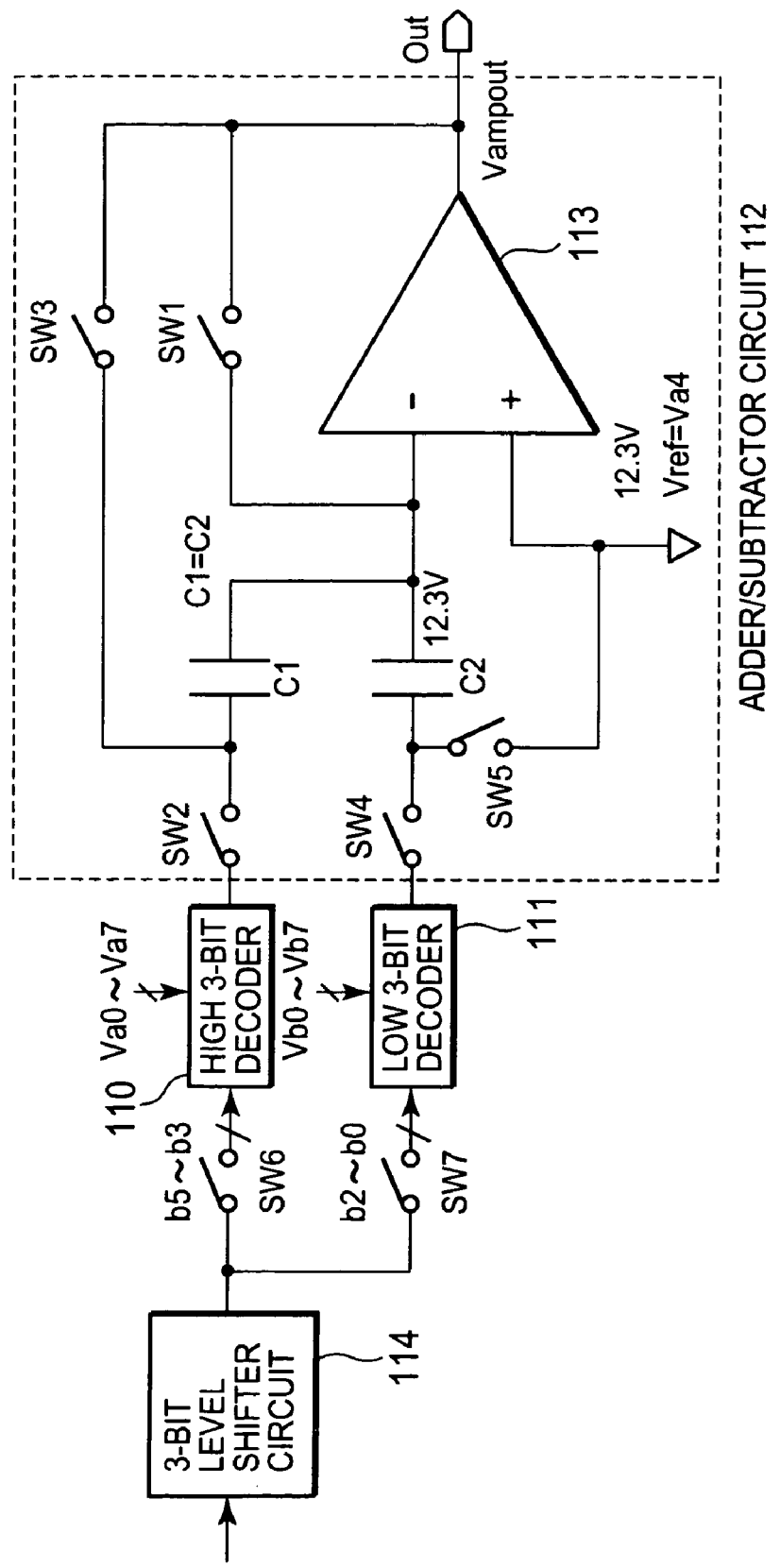
FIG. 25 is a diagram showing a configuration of a D/A conversion circuit according to a fourth exemplary embodiment.
Figure 26:
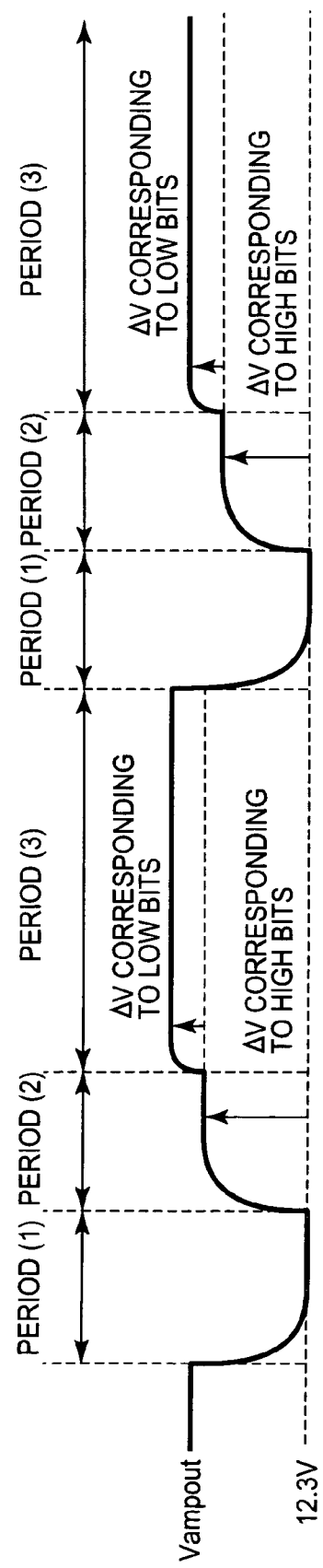
FIG. 26 is a timing chart for explaining an operation of the D/A conversion circuit according to the fourth embodiment.

A DA converter circuit according to the fourth exemplary embodiment 4 of the present invention will be described with reference to FIGS. 25 and 26. FIG. 25 is a view illustrating a configuration of a DA converter circuit according to the fourth embodiment. FIG. 26 is a timing chart for explaining the operation of the DA converter circuit according to the fourth embodiment. The DA converter circuit according to the above described embodiments requires the level shifter circuit corresponding to 6 bits which converts the voltage level of high 3-bit gradation data to be inputted to the high 3-bit decoder 110 and the voltage level of low 3-bit gradation data to be inputted to the low 3-bit decoder 111. In this way, the above described DA converter circuit requires the level shifter circuit corresponding to all the bits, so the area of the level shifter circuit section cannot be reduced. Thus, according to the fourth embodiment, a switching unit is provided so that the level shifter operation is performed on a time division basis, allowing reduction of the number of required level shifter circuits and thereby achieving further reduction of the chip area.

As illustrated in FIG. 25, in a DA converter circuit 109 according to the present embodiment, a 3-bit level shifter 114 and two switch elements SW6 and SW7 are added to the configuration of the DA converter circuit illustrated in FIG. 3. More specifically, the DA converter circuit 109 according to the present embodiment includes a high 3-bit decoder 110, low 3-bit decoder 111, adder/subtractor circuit 112, 3-bit level shifter circuit 114 and two switch elements SW6 and SW7. Voltages Va0 to Va7 generated by the gradation voltage generation circuit 108 are inputted to the high 3-bit decoder 110; and voltages Vb0 to Vb7 generated by the gradation voltage generation circuit 108 are inputted to the low 3-bit decoder 111. The adder/subtractor circuit 112 includes an amplifier circuit 113, first capacitor C1, second capacitor C2 and five switch elements SW1 to SW5.

The 3-bit level shifter circuit 114 converts, on a time division basis, the level of high 3-bit gradation data to be inputted to the high 3-bit decoder 110 and the level of low 3-bit gradation data to be inputted to the low 3-bit decoder 111. The high 3-bit gradation data obtained as a result of the level conversion by the 3-bit level shifter 114 is inputted to the high 3-bit decoder 110; the low 3-bit gradation data obtained as a result of the level conversion by the 3-bit level shifter 114 is inputted to the low 3-bit decoder 111. The switch elements SW6 and SW7 constitute switch means which selects, as the connection destination of the output of the 3-bit level shifter circuit 114, from the high 3-bit decoder 110 and low 3-bit decoder 111 at a predetermined interval.

As illustrated in FIG. 26, according to the present embodiment, the D/A conversion is performed through three periods (period (1), period (2) and period (3)).

Operation in Period (1)

In period (1), the switch elements SW1, SW2, SW5 and SW6 are turned on, and the switch elements SW3, SW4 and SW7 are turned off. As a result, the amplifier circuit 113 forms a voltage follower, so a voltage of 12.3 V of the non-inverting input terminal is outputted. Thus, one terminal of the first capacitor C1 and one terminal of the second capacitor C2 change to 12.3 V+Voff (Voff: an offset voltage of the amplifier circuit 113).

At this time, the 3-bit level shifter circuit 114 converts the level of high 3-bit gradation data. Since the switch element SW6 is in an ON state, the level-converted high 3-bit gradation data is supplied to the high 3-bit decoder 110. The high 3-bit decoder 110 selects the major (main) voltage (14.3 V in this case) corresponding to the high 3 bits. Consequently, 14.3 V is supplied to the other terminal of the first capacitor C1.

At this time, charges expressed respectively as the following formulas (24) and (25) are accumulated in the first capacitor C1 and second capacitor C2.

$$Q1=(14.3-12.3-Voff)C1=(2.0-Voff)C1 \quad (24)$$

$$Q2=(12.3-12.3-Voff)C2=(-Voff)C2 \quad (25)$$

Operation in Period (2)

In period (2), the switch elements SW3, SW4 and SW7 are turned on, and the switch elements SW1, SW2, SW5 and SW6 are turned off. As a result, the output Vampout of the amplifier circuit 113 is expressed as the following formula (26).

$$Vampout=12.3+Voff+(2.0-Voff)=14.3 \quad (26)$$

At this time, the 3-bit level shifter circuit 114 converts the level of low 3-bit gradation data. Since the switch element SW7 is in an ON state, the level-converted low 3-bit signal is supplied to the low 3-bit decoder 111. The low 3-bit decoder 111 selects the minor (sub) voltage (12.8 V in this case) corresponding to the low 3 bits. Consequently, 12.8 V is supplied to the other terminal of the second capacitor C2. At this time, a charge expressed as formula (27) is accumulated in the second capacitor C2.

$$Q2=(12.8-12.3-Voff)C2=(-Voff)C2 \quad (27)$$

Operation in Period (3)

In period (3), the switch elements SW3, SW5 and SW7 are turned on, and the switch elements SW2, SW4 and SW6 are turned off. As a result, 12.3 V is supplied to the other terminal of the second capacitor C2, and the voltage across the second capacitor C2 changes to −Voff (V). According to the law of conservation of charge, the charge accumulated in the second capacitor C2 in period (2) moves to the first capacitor C1 side.

Thus, charges accumulated in the second capacitor C2 and first capacitor C1 are expressed as the following formulas (28) and (29), respectively.

$$Q2=(12.3-12.3-Voff)C2=(0.5-Voff)C2 \quad (28)$$

$$Q1=(2.0-Voff)C1+0.5C2 \quad (29)$$

Here, assuming that there is no manufacturing variation and the capacitance of the first capacitor C1 is equal to that of the second capacitor C2, formula (29) can be expressed as below.

$$Q1=(2.5-Voff)C1 \quad (30)$$

Consequently, output Vampout of the amplifier circuit 113 changes to 14.8, and the main voltage (14.3 V) corresponding to the high bits and the sub voltage (0.5 V) corresponding to the low bits are added and outputted.

In this way, according to the present invention, the conversion period for the high bits is separated from that for the low bits, so that the 3-bit level shifter circuit 114 can be shared. Accordingly, the circuit area of the 3-bit level shifter circuit 114 can be reduced. It is noted that, while there was described the example in which the 3-bit level shifter circuit 114, and switch elements SW6 and SW7 are added to the DA converter circuit illustrated in FIG. 3, but the configuration is not limited thereto. For example, in the DA converter circuit illustrated in FIG. 14 or 20, switch means may be provided so that the level shift operation is performed on a time division basis.

Note that although description for a liquid crystal display is provided in the above embodiments, the invention is not limited to this. The present invention is applicable to other display devices employing similar D/A conversion methods and drive methods. For example, the above drive circuit may be used as a drive circuit to drive electronic papers, or future display devices that include capacitive loads.

Further, it is noted that, Applicant's intent is to encompass equivalents of all claim elements, even if amended later during prosecution.

What is claimed is:

1. A Digital-to-Analog (DA) conversion circuit comprising:
a gradation voltage generation circuit which generates a plurality of main voltages corresponding to most significant bits of an inputted data and a plurality of sub voltages corresponding to least significant bits of the inputted data;
a most-significant-bits decoder which selects one of the main voltages in accordance with the most significant bits;
a least-significant-bits decoder which selects one of the sub voltages in accordance with the least significant bits; and
a calculation circuit which performs calculation processing, based on a first main voltage selected by the most-significant-bits decoder, a first sub voltage selected by the least-significant-bits decoder, and a reference voltage, wherein:
the calculation circuit includes an amplifier circuit;
the reference voltage is inputted to a non-inverting input terminal of the amplifier circuit, and the first main voltage and the first sub voltage are inputted to an inverting input terminal of the amplifier circuit;
the calculation circuit includes a first capacitor and a second capacitor having substantially the same capacity values, the most-significant-bits decoder is connected to one end of the first capacitor while the inverting input terminal of the amplifier circuit is connected to an other end of the first capacitor;
the least-significant-bits decoder is connected to one end of the second capacitor, and the inverting input terminal of the amplifier circuit is connected to an other end of the second capacitor, and
the calculation circuit includes a second switch device connected between the most-significant-bits decoder and the first capacitor, and a third switch device connected between the least-significant-bits decoder and the second capacitor.

2. The D/A conversion circuit according to claim 1, wherein the calculation circuit includes a fourth switch device connected between the first capacitor and an output terminal of the amplifier circuit.

3. The D/A conversion circuit according to claim 1, wherein the calculation circuit includes a fifth switch device connected between the second capacitor and the reference voltage.

4. The D/A conversion circuit according to claim 1, further comprising:
a switching unit which switches between a first connection state and a second connection state, the first connection state comprising a state of connecting the most-significant-bits decoder and the first capacitor and connecting the least-significant-bits decoder and the second capacitor, and the second connection state comprising a state of connecting the most-significant-bits decoder and the second capacitor and connecting the least-significant-bits decoder and the first capacitor.

5. A Digital-to-Analog (DA) conversion circuit comprising:
a gradation voltage generation circuit which generates a plurality of main voltages corresponding to most significant bits of an inputted data and a plurality of sub voltages corresponding to least significant bits of the inputted data;

a most-significant-bits decoder which selects one of the main voltages in accordance with the most significant bits;
a least-significant-bits decoder which selects one of the sub voltages in accordance with the least significant bits;
a calculation circuit which performs calculation processing, based on a first main voltage selected by the most-significant-bits decoder, a first sub voltage selected by the least-significant-bits decoder, and a reference voltage; and
an active state controller which controls the gradation voltage generation circuit to be in an active/inactive state.

6. The DA converter circuit according to claim 5, further comprising a level shifter circuit which converts the level of the input data, wherein the level shifter circuit converts, on a time division basis, the level of a high bit of the input data and supplies the resultant data to the high bit decoder, and converts the level of a low bit of the input data and supplies the resultant data to the low bit decoder.

7. The DA converter circuit according to claim 6, further comprising a switch which performs switching between a connection state in which the level shifter circuit is connected to the high bit decoder and a connection state in which the level shifter circuit is connected to the low bit decoder.

8. A drive circuit for supplying a gradation voltage to a plurality of signal lines of a display, the drive circuit comprising:
a D/A conversion circuit according to claim 5,
wherein a plurality of decoder circuits corresponding to the plurality of signal lines are formed, the decoder circuit including the most-significant-bits decoder, the least-significant-bits decoder, and the calculation circuit.

9. A display, comprising:
a plurality of pixels;
a display panel including a plurality of signal lines transmitting a gradation voltage to the plurality of pixels; and
a drive circuit which is connected to the plurality of signal lines and which outputs a gradation voltage to the plurality of pixels,
wherein the drive circuit comprises the drive circuit according to claim 8.

10. A driver circuit including the D/A conversion circuit, according to claim 5,
wherein a plurality of decoder circuits including the most-significant-bits decoder, the least-significant-bits decoder and the calculation circuit are formed in a manner corresponding to the plurality of signal lines.

11. A display apparatus, comprising:
a display panel including a plurality of pixels and a plurality of signal lines for transmitting a gradation voltage to the plurality of pixels; and
a driver circuit connected to the plurality of signal lines to output a gradation voltage to the plurality of pixels,
wherein the driver circuit comprises a driver circuit according to claim 10.

12. A gradation voltage generation circuit, comprising:
a gradation voltage generation circuit which includes a plurality of main resistors coupled in series between a first voltage terminal and a second voltage terminal to produce a plurality of main gradation voltages, and which includes a plurality of sub resistors provided in series between adjacent main resistors among said main resistors to produce a plurality of sub gradation voltages;
a first decoder which is responsive to a first bit group of a gradation data to output a selected main gradation voltage among said main gradation voltages;
a second decoder which is responsive to a second bit group other than said first bit group of said gradation data to output a selected sub gradation voltage among said sub gradation voltages; and
an adder/subtractor circuit including:
an amplifier;
a first capacitor having a first electrode coupled to a first input terminal of said amplifier and a second electrode coupled to said first decoder via a first switch; and
a second capacitor having a first electrode coupled to said first input terminal and a second electrode coupled to said second decoder via a second switch.

13. The gradation voltage generation circuit as claimed in clam 12, further comprising:
a third switch coupled between said second electrode of said second capacitor and a second input terminal of said amplifier;
a fourth switch coupled between an output terminal of said amplifier and said second electrode of said first capacitor; and
a fifth switch coupled between said output terminal and said first electrode of said first capacitor.

14. The gradation voltage generation circuit as claimed in claim 13, wherein said first and second capacitors have substantially the same capacitance.

15. The gradation voltage generation circuit as claimed in claim 13, further comprising:
a sixth switch coupled between said second electrode of said second capacitor and said output terminal;
a seventh switch coupled between said second electrode of said first capacitor and said second input terminal; and
a switch circuit coupled between both said first and second switches and both said first and second decoders.

16. The gradation voltage circuit as claimed in claim 13, further comprising:
a switch circuit which isolates said main and sub resistors from said first and second voltage terminals.

17. The gradation voltage circuit as claimed in claim 13, wherein said first bit group and said second bit group are alternately applied to said first and second decoders, respectively.

18. A method of producing a gradation voltage, comprising:
supplying a first electrode of a first capacitor with a selected main gradation voltage from a first decoder during a first period;
supplying a first electrode of a second capacitor with a selected sub gradation voltage from a second decoder during said first period;
supplying second electrodes of said first and second capacitors with a voltage at a first input terminal of an amplifier by a first switch turning on provided between said first input terminal and an output terminal of said amplifier during said first period;
isolating said first electrodes of said first and second capacitors from said first and second decoders, respectively, during a second period;
turning off said first switch during said second period;
connecting said first electrode of said second capacitor to a second input terminal of said amplifier, said second input terminal receiving a reference voltage during said second period; and
connecting said first electrode of said first capacitor to said output terminal.

19. The method as claimed in claim 18, further comprising:
supplying said first electrode of said first capacitor with a selected sub gradation voltage from said second decoder during a third period; and
supplying said first electrode of said second capacitor with a selected main gradation voltage from said first decoder during said third period.

20. The method as claimed in claim 18, further comprising:
wherein a first bit group and a second bit group are alternately applied to said first and second decoders, respectively.

* * * * *